United States Patent
Dohner et al.

(10) Patent No.: US 12,349,521 B2
(45) Date of Patent: Jul. 1, 2025

(54) ADHESIVE FILM TRANSFER COATING AND USE IN THE MANUFACTURE OF LIGHT EMITTING DEVICES

(71) Applicant: LUMILEDS LLC, San Jose, CA (US)

(72) Inventors: Emma Dohner, Redwood City, CA (US); Grigoriy Basin, San Francisco, CA (US); Daniel B. Roitman, Menlo Park, CA (US); Vernon K. Wong, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 717 days.

(21) Appl. No.: 17/713,485

(22) Filed: Apr. 5, 2022

(65) Prior Publication Data
US 2022/0231204 A1 Jul. 21, 2022

Related U.S. Application Data

(62) Division of application No. 16/874,529, filed on May 14, 2020, now Pat. No. 11,322,665.

(51) Int. Cl.
*H10H 20/851* (2025.01)
*H01L 25/075* (2006.01)
*H10H 20/01* (2025.01)

(52) U.S. Cl.
CPC ..... *H10H 20/8514* (2025.01); *H01L 25/0753* (2013.01); *H10H 20/0361* (2025.01)

(58) Field of Classification Search
None
See application file for complete search history.

(56) References Cited

U.S. PATENT DOCUMENTS

| | | | |
|---|---|---|---|
| 8,075,970 B2 | 12/2011 | Ikeda et al. | |
| 9,080,103 B2 | 7/2015 | Shirakawa et al. | |
| 9,166,118 B2 | 10/2015 | Ajiki et al. | |
| 9,722,146 B2 | 8/2017 | Kwak et al. | |
| 9,964,685 B2 | 5/2018 | Li et al. | |
| 11,322,665 B2 | 5/2022 | Dohner et al. | |
| 2007/0004065 A1 | 1/2007 | Schardt et al. | |
| 2014/0091346 A1 | 4/2014 | Fujii et al. | |
| 2014/0339258 A1 | 11/2014 | Matsumura et al. | |
| 2014/0339582 A1 | 11/2014 | Matsumura et al. | |
| 2015/0225900 A1 | 8/2015 | Sher et al. | |
| 2019/0244938 A1 | 8/2019 | Bang et al. | |

FOREIGN PATENT DOCUMENTS

| | | |
|---|---|---|
| CN | 101220246 A | 7/2008 |
| CN | 103153611 A | 6/2013 |
| EP | 2712908 A2 | 4/2014 |

(Continued)

OTHER PUBLICATIONS

A machine-generated English translation of JP 2014-110333 (Year: 2014).*

(Continued)

*Primary Examiner* — Bo B Jang

(57) ABSTRACT

A converter layer bonding device, and methods of making and using the converter layer bonding device are disclosed. A converter layer bonding device as disclosed herein includes a release liner and an adhesive layer coating the release liner, the adhesive layer is solid and non-adhesive at room temperature, and is adhesive at an elevated temperature above room temperature.

19 Claims, 21 Drawing Sheets

(56) References Cited

FOREIGN PATENT DOCUMENTS

| JP | 2006245091 A | 9/2006 |
|---|---|---|
| JP | 2014110333 A | 6/2014 |
| JP | 2017028010 A | 2/2017 |
| JP | 2017168808 A | 9/2017 |
| KR | 20140042727 A | 4/2014 |
| WO | 2012/026757 A2 | 3/2012 |

OTHER PUBLICATIONS

"Adhesive Bonding Technology", Sichuan People's Publishing House, Jul. 1980, p. 135.
English translation of "Adhesive Bonding Technology", Sichuan People's Publishing House, Jul. 1980, p. 135.
From the Korean Intellectual Property Office as the ISA, Notification of the International Search Report and the Written Opinion of the International Searching Authority, corresponding to PCT/US2021/032243, Aug. 31, 2021, 13 pages.
The extended European Search Report corresponding to EP 20178283.6, Nov. 20, 2020, 10 pages.
Cree, "Cree XLamp LEDs Chemical Compatibility", CLD-AP63 Rev 6A Aug. 2018, 23 pages.
Ekeland, Robert, Ph.D et al., "Release Force Understanding—Recent Findings", Dow White Paper, 2018 The Dow Chemical Company, Form No. 30-1139-01 A, 8 pages.
Roitman et al., U.S. Appl. No. 62/738,631, "Fabrication for Precise Line-Bond Control and Gas Diffusion Between LED Components", filed Sep. 28, 2018, 13 pages.

\* cited by examiner

ADHESIVE FILM TRANSFER COATING AND USE IN THE MANUFACTURE OF LIGHT EMITTING DEVICES

CROSS REFERENCE TO RELATED APPLICATIONS

This application is a divisional of U.S. patent application Ser. No. 16/874,529 filed on May 14, 2020, which is incorporated herein by reference in its entirety.

FIELD OF THE INVENTION

This disclosure generally relates to devices and methods used in the manufacture of light emitting devices (LEDs) for attaching phosphors to LED dies, and LEDs formed using the devices and methods.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphors may be embedded in a silicone matrix that is disposed in the path of light emitted by the LED.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

In one aspect, a converter layer bonding device includes a release liner and an adhesive layer coating the release liner, the adhesive layer is solid and non-adhesive at a first temperature, and is adhesive at an elevated temperature above the first temperature. The adhesive layer may have a thickness of less than 10 µm. The adhesive layer may have a thickness between 0.3 µm and 2 µm. The adhesive layer may be configured to bond to a substrate at the elevated temperature, and the release liner may be configured to be removable after the adhesive layer is bonded to the substrate. The adhesive layer may be configured to form a bond layer between the substrate and a phosphor in contact with the adhesive layer opposite the substrate.

In another aspect, a method for forming a converter layer bonding device includes mixing an adhesive material and a solvent to form an adhesive mixture, coating a sheet of release liner with the adhesive mixture, and drying the solvent from the adhesive mixture coated onto the release liner to form an adhesive layer, the adhesive layer being solid and non-adhesive at a first temperature, and adhesive at an elevated temperature above the first temperature.

In yet another aspect, a light emitting device includes a light emitting diode, a phosphor, and a bond layer between and in contact with the light emitting diode and phosphor, the bond layer configured to bond the light emitting diode to the phosphor, the bond layer having a thickness that is uniform, the thickness varying less than 10%. The thickness of the bond layer may be less than 10 µm. The thickness of the bond layer may be between 0.3 µm and 2 µm. The bond layer may be transparent. A surface of the phosphor or the light emitting diode in contact with the bond layer may have a surface roughness, and the bond layer may conform to the surface roughness while maintaining the uniform thickness. An edge of the phosphor and an edge of the bond layer may align on a same plane. The bond layer may include multiple channels, which may have openings on an edge of the bond layer.

In yet another aspect, a light emitting device may include a plurality of individually addressable light emitting diodes mounted on a single chip, a plurality of phosphor tiles, and a bond layer between each of the individually addressable light emitting diodes and phosphor tiles, the bond layer having a thickness that is uniform, the thickness varying less than 10% between each individually addressable light emitting diode and phosphor tile across the single chip. The thickness of the bond layer may be less than 10 µm. The thickness of the bond layer may be between 0.3 µm and 2 µm. The bond layer may be transparent. The plurality of LED die may be mounted on a tile, a portion of the plurality of LED die may have a height from the tile that varies from another portion of the plurality of LED die, the bond layer maintaining uniform thickness on the plurality of LED die. Surfaces of the plurality of phosphor tiles in contact with the bond layer may have a surface roughness, and the bond layer may conform to the surface roughness while maintaining the uniform thickness. Surfaces of the plurality of light emitting diodes in contact with the bond layer may have a surface roughness, and the bond layer may conform to the surface roughness while maintaining the uniform thickness. The bond layer may include multiple channels. The multiple channels may have openings on an edge of the bond layer. The bond layer may include a first bond layer in contact with the plurality of phosphor tiles and a second bond layer in contact with the plurality of light emitting diodes and the first bond layer. The first bond layer may have a different physical characteristic from the second bond layer. The first bond layer may include multiple channels. The first bond layer may have a different refractive index from the second bond layer.

In yet another aspect, a method of forming a light emitting device includes aligning a converter layer bonding device over a phosphor, the converter layer bonding device including an adhesive layer adhered to a release liner, a first surface of the adhesive layer opposite the release liner facing a surface of the phosphor, bringing the first surface of the adhesive layer and the surface of the phosphor into contact at an elevated temperature, the elevated temperature being a temperature at which the adhesive layer adheres to the phosphor, cooling the adhesive layer adhered to the phosphor, removing the release liner from the adhesive layer, bringing one or more LED die into contact with a second surface of the adhesive layer opposite the first surface, and heating the adhesive layer, LED die, and phosphor to cure the adhesive layer and form a bond layer between the LED die and the phosphor. The adhesive layer may be solid and non-adhesive at a first temperature below the elevated temperature. The G* (at 1 Hz) of the adhesive layer at the first temperature may be greater than 100 KPa, and the G* (at 1 Hz) of the adhesive layer at the elevated temperature may be between 1 KPa and 100 KPa. Bringing the first surface of the adhesive layer and the surface of the phosphor into contact at an elevated temperature may include applying a vacuum to the converter layer bonding device and the phosphor. The method may further include dicing the phosphor and the bonding layer between the LED die. The method may further include, after removing the release liner, cutting the phosphor and adhesive layer into n×m arrays, and wherein bringing one or more LED die into contact with the adhesive layer opposite the phosphor comprises bringing each LED die into contact with an n×m array. The method may further include cutting channels into the adhesive layer on the converter layer bonding device. The method may further include, before bringing one or more LED die into contact with adhesive layer, aligning a second converter layer bonding device over the adhesive layer, the second converter layer bonding device comprising a second adhesive layer adhered to a second release liner, a first surface of the second adhesive layer opposite the second release liner facing the second surface of the adhesive layer, bringing the second adhesive layer and a surface of the adhesive layer opposite the phosphor into contact at an elevated temperature, the elevated temperature being a temperature at which the second adhesive layer adheres to the adhesive layer, cooling the second adhesive layer adhered to the adhesive layer, removing the second release liner from the second adhesive layer, and bringing the LED die into contact with a surface of the second adhesive layer opposite the adhesive layer.

In yet another aspect, a method of forming a light emitting device includes attaching a plurality of LED die to a tile, aligning a converter layer bonding device over the plurality of LED die, the converter layer bonding device comprising an adhesive layer adhered to a release liner, a first surface of the adhesive layer opposite the release liner facing surfaces of the plurality of LED die that are opposite the tile, bringing the first surface of the adhesive layer and surfaces of the plurality of LED die into contact at an elevated temperature, the elevated temperature being a temperature at which the adhesive layer adheres to the LED die, cooling the adhesive layer adhered to the plurality of LED die, removing the release liner from the adhesive layer, leaving portions of the adhesive layer adhered to each LED die and remaining portions of the adhesive layer being removed with the release liner, bringing a plurality of phosphor tiles each into contact with a portion of the adhesive layer adhered to each of the plurality of LED die, heating the adhesive layer, LED die, and phosphor to cure the adhesive layer and form a bond layer between the LED die and the phosphor. The adhesive layer is solid and non-adhesive at a first temperature below the elevated temperature, and adhesive at the elevated temperature. Bringing the first surface of the adhesive layer and surfaces of the plurality of LED die into contact at an elevated temperature may include applying a vacuum to the converter layer bonding device and the plurality of LED die. A height of each of the plurality of LED die from the tile varies, and the bond layer has a uniform thickness, the thickness varying less than 10% over the plurality of LED die.

DETAILED DESCRIPTION

Figure 1A:
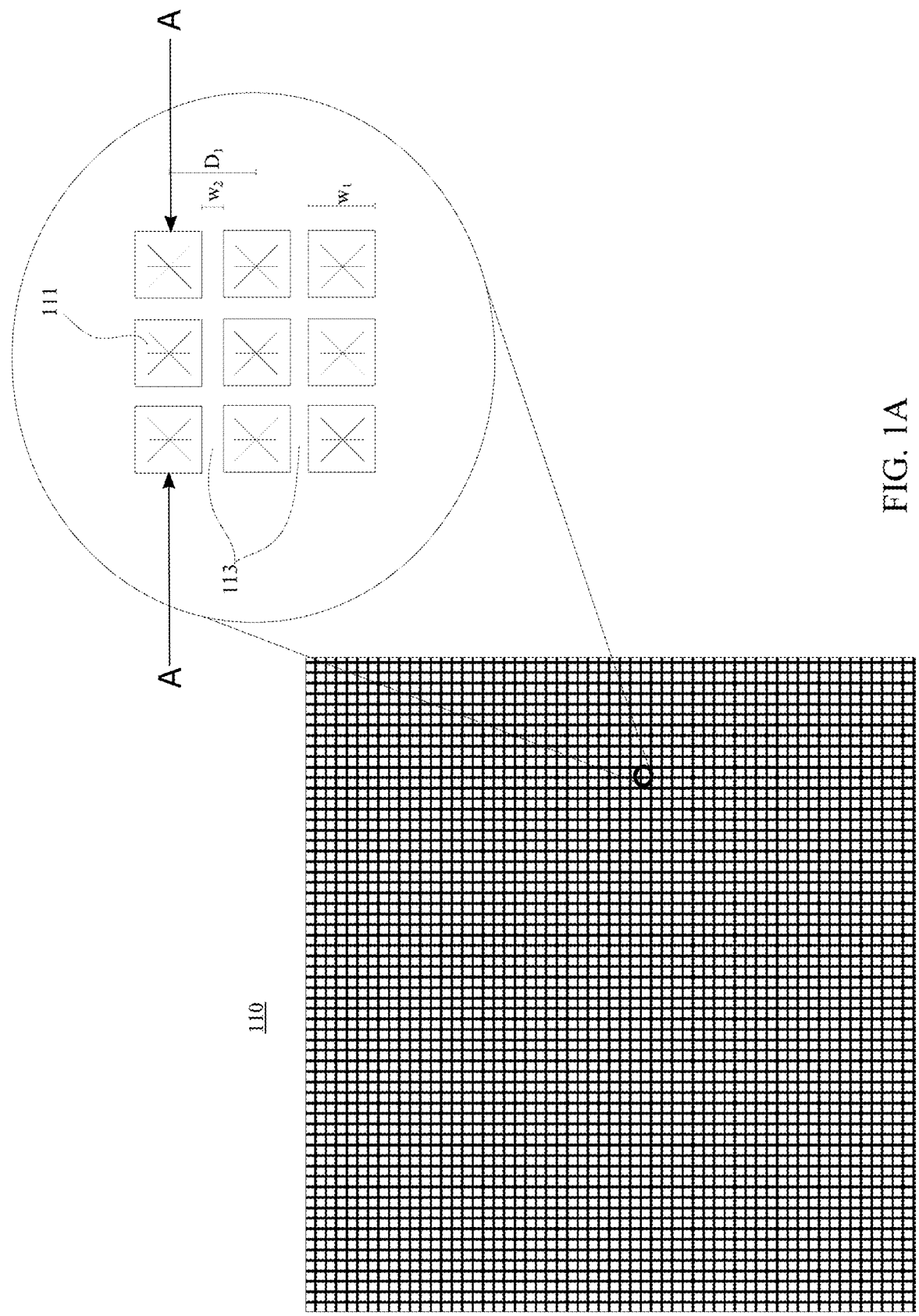
FIG. 1A is a plan view and FIG. 1B a cross-sectional view illustrating an example of a micro-LED. The cross-section view in FIG. 1B is taken through line A-A in FIG. 1A.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

As used herein, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below, depending on the orientation of the device. The device may be otherwise oriented (rotated 90 degrees or at other orientations) and the spatially relative descriptors used herein interpreted accordingly.

Light emitting pixel arrays are light emitting devices in which a large number of small light emitting devices, such as, for example LEDs, are arrayed on a single chip. The individual LEDs, or pixels, in a light emitting pixel array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Light emitting pixel arrays have a wide range of applications. Light emitting pixel array luminaires can include light fixtures which can be programmed to project different lighting patterns based on selective pixel activation and intensity control. Such luminaires can deliver multiple controllable beam patterns from a single lighting device using no moving parts. Typically, this is done by adjusting the brightness of individual LEDs in a 1D or 2D array. Optics, whether shared or individual, can optionally direct the light onto specific target areas Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate. Automotive headlights that actively illuminate only selected sections of a roadway can be used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Figure 1B:
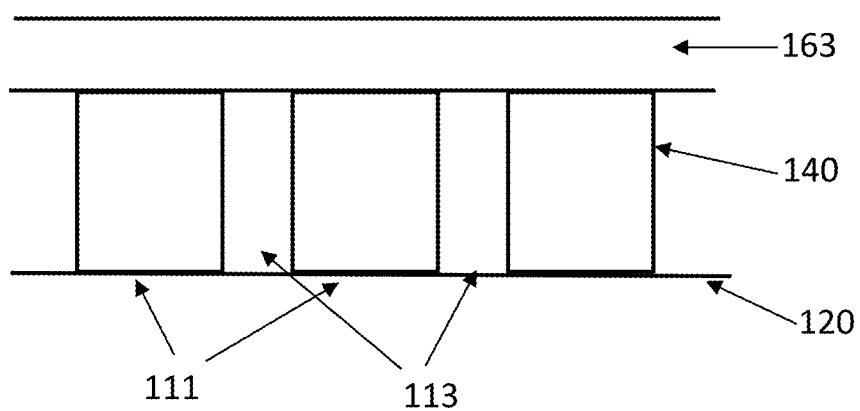

An example of a type of light emitting pixel array is a micro-LED, also referred to as a μLED. FIGS. 1A and 1B illustrate an example of a micro-LED. FIG. 1A shows a plan view of a micro-LED array 110, along with an exploded view of a 3×3 portion of LED array 110. In FIG. 1A, each square 111 represents a single LED, or pixel. As shown in the 3×3 portion exploded view, LED array 110 may include pixels 111 with a width w1, which may be between 30 μm and 500 μm, for example approximately 100 μm or less, e.g. 40 μm. The gaps, or lanes, 113 between the pixels may be separated by a width, w2, which may be between 30 μm and 500 μm, for example, approximately 20 μm or less, e.g., 5 μm. The lanes 113 may provide an air gap between pixels or may contain other material, as shown in FIG. 1B. The distance d1 from the center of one pixel 111 to the center of an adjacent pixel 111 may be approximately 120 μm or less (e.g., 45 μm). Such a micro-LED array may have hundreds, thousands, or millions of LEDs positioned together on substrates that may have, for example, an area in the range of centimeters, although the size of the area may vary. It will be understood that the widths and distances provided herein are examples only, and that actual widths and/or dimensions may vary. For instance, the width, w2, may be in the order of at least a millimeter, to form a sparse micro-LED, but may be larger or smaller.

It will be understood that although rectangular pixels arranged in a symmetric matrix are shown in FIGS. 1A and 1B, pixels of any shape and arrangement may be applied to the embodiments disclosed herein. For example, LED array 110 of FIG. 1A may include 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

Micro-LEDs can be formed from pcLEDs. One method for forming a micro-LED is to use epitaxial growth to form the multiple individual LEDs 110 on a die in a flip-chip construction as in known in the art. FIG. 1B illustrates a side view of a portion of one type of micro-LED device taken through line AA of FIG. 1A.

FIG. 1B shows the pixels 111 and lanes 113. Each pixel 111 is formed of an LED die 140, which is positioned on, for example, a chip 120, which may provide the electrical signals to the LED die 140. A phosphor 163 is over and on LED dies 140. The phosphor 163 may be formed of phosphor particles contained in a matrix, for example, garnet particles contained in silicone. Alternatively, or in addition, the phosphor 163 contains a densely sintered phosphor ceramic, such as Lumiramic™. In one example, the individual LEDs produce a blue light and the phosphor converts the blue light to a white light to produce a micro-LED that is monochrome white at a CCT of about 5700K. FIG. 1B shows phosphor 163 as a single plate covering both the LED dies 140 and the gaps 113 between the LED dies 140. However, phosphor 163 may be singulated, and cover just the individual LED dies 140, as shown in more detail in examples below.

One method of forming a pcLEDs, including micro-LEDs, is to separately form a phosphor converting material into a tile (which also may be referred to as a plate, platelet, wafer, film or other shape), such as, for example, Lumiramic™, as phosphor 163. The phosphor, which is also referred to as a phosphor tile, is then attached or bonded to the separately formed LED die or plurality of LED dies.

The phosphor tile is typically attached or bonded to an LED or substrate using a layer of an adhesive positioned between the LED dies and the phosphor. The dimensions and uniformity of this adhesive layer are critical to the optical and thermal performance of the device, as well as its mechanical robustness.

In current manufacturing, there are several different methods used to apply this adhesive layer. One approach is to dispense a small volume of an adhesive solution (typically a liquid containing silicones and solvents) onto the surface of the LED die. A phosphor plate is then placed on top of the die. The droplet of adhesive solution then flows out the edges of the plate, and once dried and cured, forms a thin bond-line between die and phosphor. Another approach is to coat a similar adhesive solution onto a continuous phosphor wafer or film by a method such as spin-coating, spray-coating, or aerosol-jet printing. After coating the phosphor wafer or film, the phosphor is singulated to form plates, which are then attached to the LED die and the adhesive film cured. Each of these methods has its own drawbacks.

In the adhesive solution dispense approach, the final gap between the ceramic phosphor and the die is typically determined by a combination of factors, such as: the surface tension and viscosity of the adhesive solution, force and time of the "pick and place" tool, volume of the droplet, position of the droplet relative to the center of the surface of the die, temperature of the die, time elapsed between droplet dispense and attach, and rate of solvent evaporation. Unfortunately, this is a complex process that is difficult to control, and thus results in large variability of the average thickness between devices as well as large variability within each device. Additionally, this is a serial process (each adhesive solution droplet is dispensed sequentially), which decreases throughput. This process also does not scale well to micro-LEDs due the impractically small volumes of adhesive required. In the approach where the phosphor wafer or film is coated with adhesive first and then singulated, surface roughness can lead to adhesive layer non-uniformity. Even if the surface is smooth, if the surface energy of the converter layer of film is too low or too variable, the adhesive solution could partially de-wet coating, leading to an incomplete layer.

Figure 2:
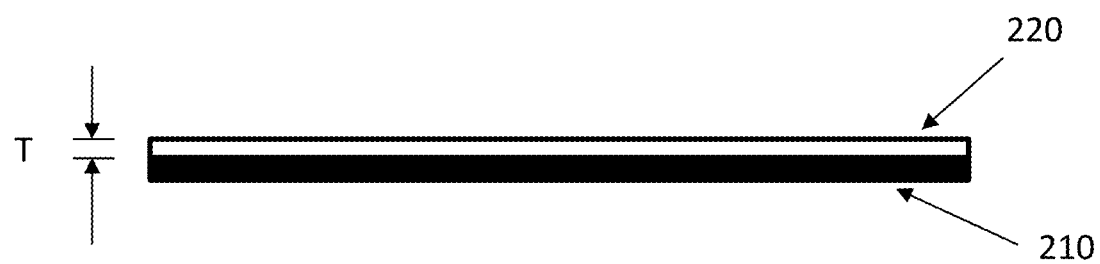
FIG. 2 is a cross-sectional view illustrating a converter layer bonding device according to an example embodiment.

FIG. 2 shows a converter layer bonding device 200 that can be used to form pcLEDs, and in particular, is useful for forming light emitting pixel arrays, such as micro-LEDs. Converter layer bonding device 200 includes a release liner 210 coated with an adhesive layer 220.

Release liner 210 may be any material, generally in the form of a flexible sheet, capable of holding adhesive layer 220 and capable of releasing adhesive layer 220 in operation (as shown below in FIGS. 4A-4D). Thus, the release liner 210 may be optimized (e.g., for roughness, slippage, and surface energy) so that the adhesive layer 220 coats the release liner 210 evenly, and so that the release liner 210 can release cleanly from the adhesive layer 220 after adhesive layer 220 is transferred to a substrate. Release liner 210 may be a sheet of flexible material, such as polyethylene terephthalate ("PET"), such as, for example, PANAC Corporation SP-PET-50-01 BU. Release liner 210 may be coated with a transfer coating (not shown) positioned between the release liner 210 and the adhesive layer 220 that enhances the release of the adhesive layer 220. Such a transfer coating may be, for example, a siliconized release coating, examples of which include PANAC Corporation's PDMS release coating on PET liners and as further described in Dow White Paper "*Release Force Understanding—Recent Findings*" by R. Ekeland, J. Tonge, and G. Gordon, 2018, The Dow Chemical Company, incorporated herein by reference in its entirety. In particular, when the release liner 210 is removed (as shown in the examples below), to ensure a clean transfer of the adhesive layer 220 to the substrate, the peel strength between the adhesive layer 220 and release liner 210 may be below 30 N/m, for example, between 1-5 N/m.

Adhesive layer 220 is the adhesive that is transferred to a substrate and that forms a bond layer (as shown below in FIGS. 4A-4D). The material used to form the adhesive layer 220 may be chosen to have the following properties. The first is that the material can be coated evenly onto the release liner 210 to form the converter layer bonding device 200. The second is that the material forms an adhesive layer 220 that is dry, not tacky, and relatively hard, i.e., it does not flow, at a first, lower temperature, e.g., room temperatures. That is, at a first temperature, such as room temperatures, e.g., 15-25° C., the adhesive layer 220, while adhering to the release liner 210 on which it was formed, is not adhesive enough to attach to a substrate, such as a phosphor tile or LED die. For example, the adhesive layer 220 at a first temperature, such as room temperature, may follow the Dahlquist Criterium of G*(at 1 Hz)>100 KPa (0.1 MPa), for example G*>300 KPa (0.3 MPa). Third, the material forming the adhesive layer 220 becomes tacky and reflows at elevated temperatures. That is, when heat is applied to the adhesive layer 220, it becomes adhesive, and is then capable of attaching to a substrate. For example, an elevated temperature is chosen such that the G* (at 1 Hz) of adhesive layer 220 becomes between G*=1 KPa and G*=100 KPa, with tan delta typically between 0.5 and 3.0, for example, at between 50° C. and 150° C., e.g., 100° C. Fourth, the material used to form the adhesive layer 220 is capable of forming a bond layer that provides a strong bond between a phosphor and a target substrate. The bond layer may be transparent, or may have additional optical characteristics, such as scattering, R1 gradient, and emissivity, as disclosed in more detail below.

In particular, the adhesive layer 220 may not be adhesive enough to attach to a substrate at a first, lower temperature, but becomes adhesive enough at elevated temperature to attach to a substrate, such as a phosphor or LED die, and, after cooling, has a stronger attachment to the substrate than to the release liner 210, such that the release liner may be easily removed.

The thickness T of the adhesive layer 220 is chosen to match the desired target thickness of the bond layer in the final device, and may be in a range of 0.3 μm to 30 μm, for example, less than 10 μm, in the range of between 0.3 μm and 2 μm. The adhesive layer 220 is also formed so that the thickness T is uniform across the layer, for example, T will have a deviation (variation) of less than 20%, for example, less than 10%, across, the adhesive layer 220. The material used to form the adhesive layer 220 may be, for example, a siloxane adhesive.

FIGS. 3A-3D show a flow chart and illustration of a method of making a converter layer bonding device 200. At S310, the release liner 210 to be used may be coated with a siliconized coating to enhance the release properties as described above. At S320 an adhesive mixture 302 may be prepared by mixing the adhesive material with a solvent, for example, a resin and solvent, such as a methylphenylsiloxane resin and cyclohexanone solvent, and for example a silicone resin (such as Dow Corning® LF-1112) and a propylene glycol methyl ether acetate solvent. Mass ratios of adhesive material to solvent may be between 10:1 and 1:1. The concentrations of adhesive material and solvent may be chosen to achieve the desired viscosity of the adhesive mixture 302. The viscosity of the adhesive mixture 302 may be chosen to optimize wetting of the release liner 210, while still achieving the desired thickness T of the adhesive layer 220 in the converter layer bonding device 200. For example, the viscosity of the adhesive mixture 302 may range between 70 and 3,000 mPa's (or cP).

Figure 3A:
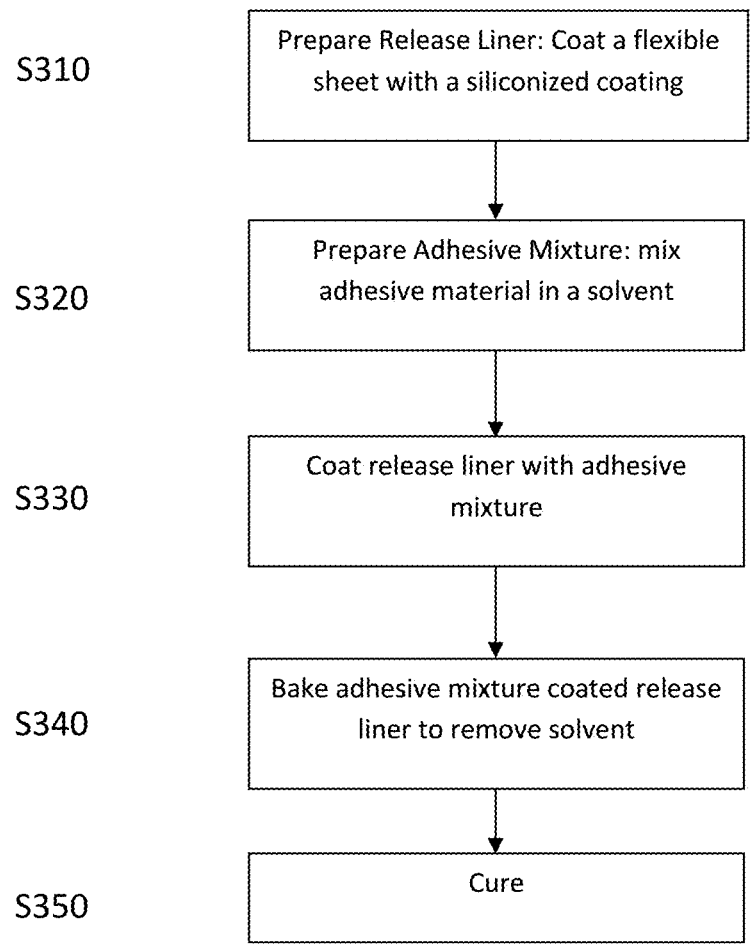
FIG. 3A shows a flow chart for, and FIG. 3B, FIG. 3C and FIG. 3D illustrate an example embodiment of a method for making a converter layer bonding device.
Figure 3B:
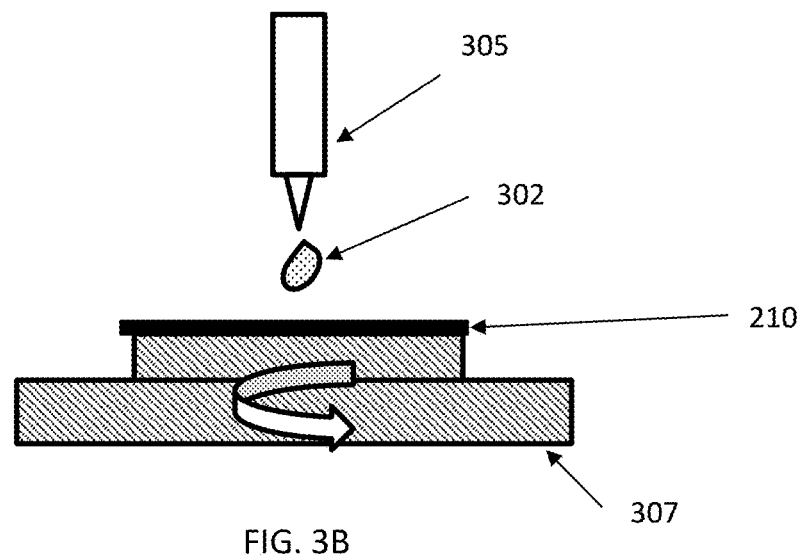

As shown in FIG. 3B, at S330 the adhesive mixture 302 is coated onto the release liner 210. Any method that can suitably coat the release liner 210 with a uniform layer of the adhesive mixture 302 at the desired thickness may be used, such as, for example, spin-coating, gravure coating, etc. FIG. 3B illustrates, as an example, a spin-coating process for coating release liner 210 with the adhesive mixture 302. In FIG. 3B, the release liner 210 is positioned on a spin-coating support 307 and the adhesive mixture 302 is deposited from nozzle 305 as is known by persons having ordinary skill in the art.

Figure 3C:
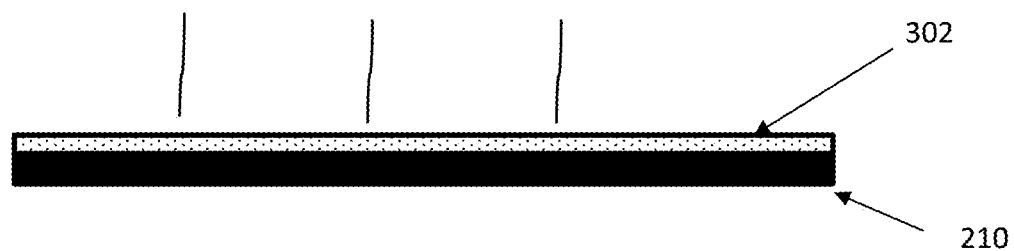
Figure 3D:

As shown in FIG. 3C, at S340 the adhesive mixture 302 coated onto release liner 210 is dried to remove solvent. Depending on the adhesive used, at S350 the adhesive mixture may be additionally cured to stabilize the material and improve uniformity of the subsequent transfer from the converter layer bonding device 200. The resulting converter layer bonding device 200 is shown in FIG. 3D. This process results in an adhesive layer 220 that may be thin (may be under 4 µm), uniform, defect-free, and can be made in a large area, such as such as from 0.1 m to 3 m wide, and even tens of meters to thousands of meters in length, such as in a roll. Note that roll-to-roll methods such as gravure coating technology may be used for large area coating.

FIGS. 4A-4E show a flow chart and illustration of an example of the method of using the converter layer bonding device 200. A vacuum lamination process may be used to transfer the adhesive layer 220 onto a substrate 415.

Figure 4A:
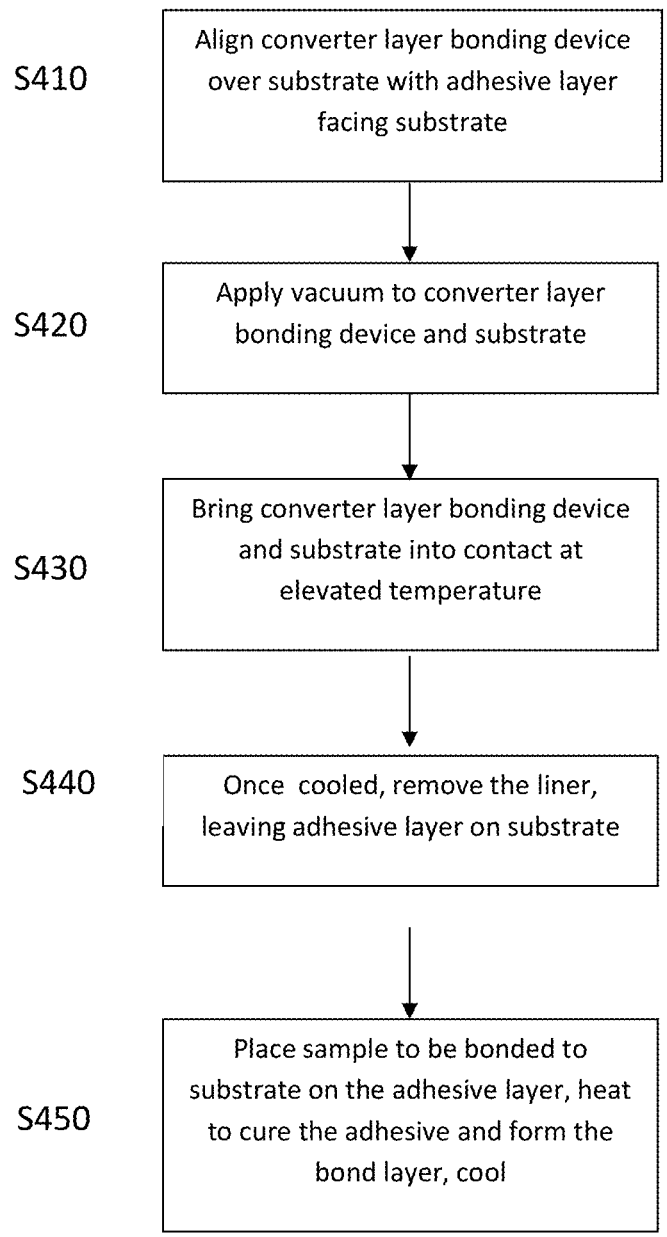
FIG. 4A shows a flow chart for, and FIG. 4B, FIG. 4C, FIG. 4D and FIG. 4E illustrate an example embodiment of a method of using a converter layer bonding device according to example embodiments.
Figure 4B:
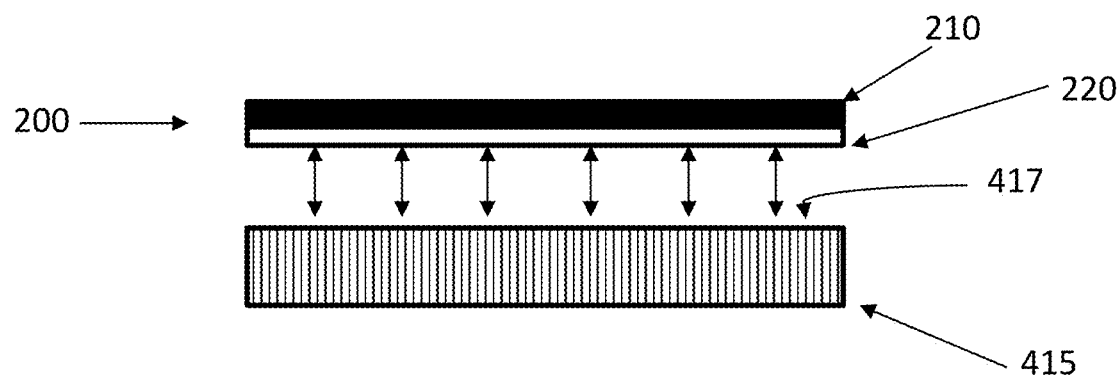

As shown in FIG. 4B, at S410, a converter layer bonding device 200 may be aligned over a substrate 415. As shown in FIG. 4B, the adhesive layer 220 of the converter layer bonding device 200 is facing a surface 417 of the substrate 415 to which the adhesive layer 220 is to be applied.

Figure 4C:
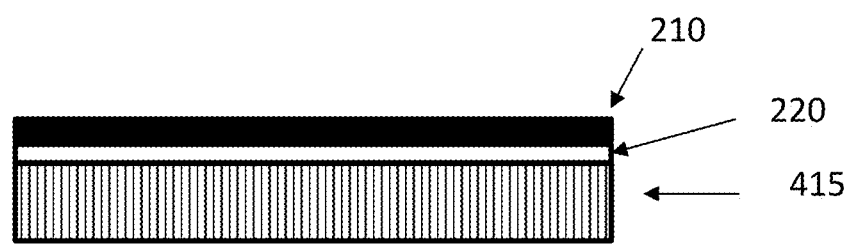
Figure 4D:
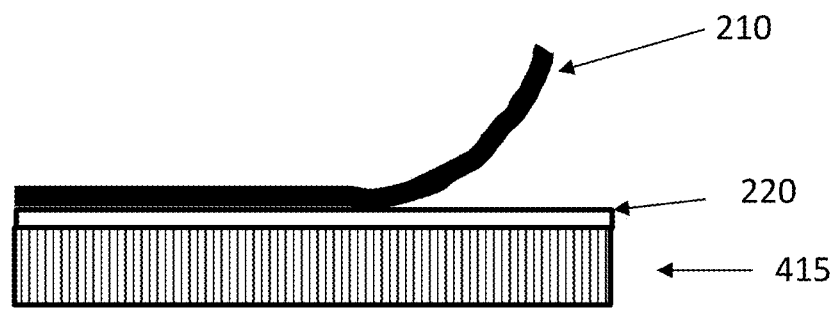

As shown in FIG. 4C, at S420, a vacuum may be applied to the converter layer bonding device 200 and substrate 415, and at S430, the converter layer bonding device may be brought into contact with the substrate at elevated temperatures. The temperature used depends on the particular adhesive material that forms the adhesive layer. In general, the temperature is high enough to make the adhesive layer 220 flow and become tacky, i.e., adhesive, enough to stick to the substrate 415. The elevated temperature may be chosen such that the G* (at 1 Hz) is between G*=1 KPa, and G*=100 KPa, with tan delta typically between 0.5 and 3.0. At the same time, the temperature should be low enough to prevent excessive flow, so that the adhesive layer 220 maintains its shape and coverage of the substrate 415. The substrate 415 with the converter layer bonding device 200 attached may then be cooled, for example, back to room temperature As shown in FIG. 4D, at S440, once the adhesive liner 220 has cooled, the release liner 210 may be removed, leaving a continuous layer of the adhesive behind on the substrate 415. As the adhesive layer 220, after heat treatment, is more strongly attached to the substrate than the release liner 210, the release liner 210 may be removed, for instance, mechanically by peeling off the adhesive layer 220 that is attached to substrate 415. As noted above, the ensure clean transfer, the release liner may be designed to have a peel strength between the adhesive layer 220 and release liner 210 of below 30 N/m, for example 1-5 N/m. The adhesive layer 220 remains on the substrate 415 after removal of release liner 210.

Figure 4E:
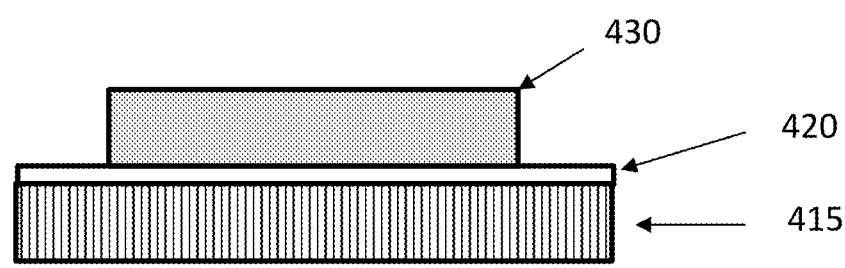

As shown in FIG. 4E, at S450, the sample 430 to be bonded to substrate 415 may be brought into contact with the transferred adhesive layer 220. Heat may be applied to cure the adhesive layer and form a bond layer 420 between the substrate 415 and sample 430. The bonded substrate 415 and sample 430 may then be cooled.

The thickness of the resulting bond layer 420 may be very thin, and be between 0.3 µm and 30 µm, for example, between 0.3 µm and 2 µm. The bond layer 420 has a uniform thickness over the surface of the substrate to which it is applied, and the variation in thickness across the bond layer may be less than 20%, and for example, may be less than 10%. For example, for a bond layer 420 that has a thickness of 1 µm, the variation in thickness across the bond layer between substrate 415 and sample 430 would be less than +/−0.2 µm at a 20% variation, and +/−0.1 µm at a 10% variation. Additionally, if the substrate 415 has a relatively large area on which numerous minute LED dies are form, such as, for example, as is used for making a light emitting pixel array, such as a micro-LED, the adhesive layer 220 and subsequent bond layer 420 provides a thin and uniform bond layer over the entire area of the device and form the numerous minute light emitters. Thus, for a micro-LED having thousands to millions of individually addressable LEDs over and area with, for example, 5-50 µm per side (25-2,500 µm$^2$) or for somewhat larger arrays, for example, 50-500 µm per side (2,500-25,000 µm$^2$), the bond layer 420 is uniform, which improves the performance of the device. Further advantages of the bond layer 420 formed from the converter layer bonding device 200 as disclosed herein are described in more detail below.

The bond layer 420 may be transparent. The bond layer 420 may also include dispersed particles and/or dyes which could provide additional optical, physiochemical or mechanical characteristics, such as higher refractive index, enhanced light scattering, light absorption or emission at different wavelengths. To form a bond layer 420 having dispersed particles and/or dyes, the particles and/or dyes may be included in the adhesive mixture 302 (at S320) used to form the adhesive layer 220 on the converter layer bonding device 200.

FIGS. 5A-5E illustrate an example application of the converter layer bonding device in which the adhesive layer is transferred onto a phosphor, followed by die attach. A converter layer bonding device 200 may be prepared as described above with respect to FIGS. 2A-2D.

Figure 5A:
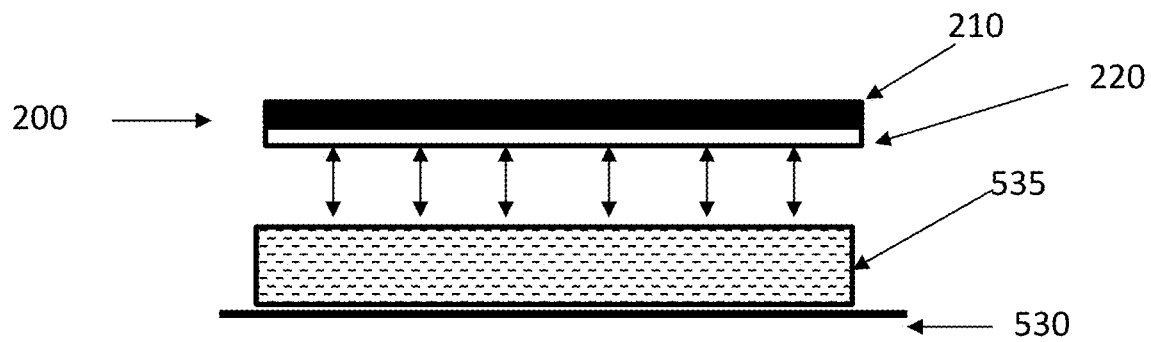
FIG. 5A, FIG. 5B, FIG. 5C, FIG. 5D and FIG. 5E illustrate an example application of a converter layer bonding device as disclosed herein and resulting pcLED device.
Figure 5B:
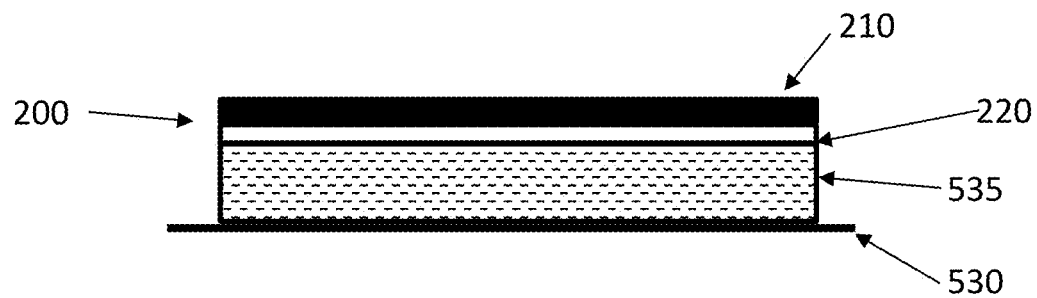
Figure 5C:
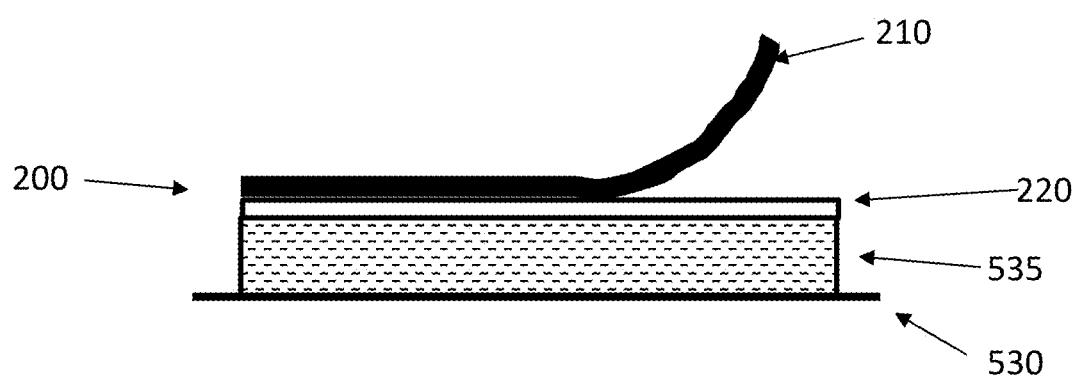
Figure 5D:
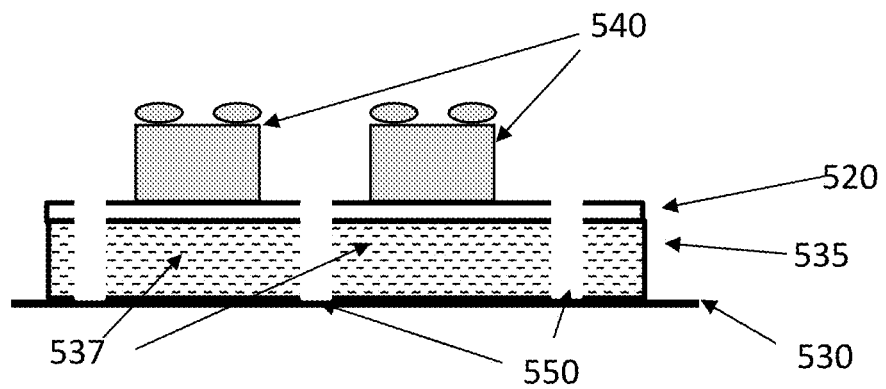

In FIG. 5A, a phosphor film or wafer 535, such as, for example, a Lumiramic™ tile, may be mounted onto a carrier tape 530. The phosphor wafer 535 may be 02-plasma treated to improve adhesion of subsequently-transferred adhesion layer 220. Vacuum lamination may then be used to transfer the adhesive layer 220 onto the phosphor wafer 535 as follows. As shown in FIG. 5A, the converter layer bonding device 200 may be aligned over the phosphor 535 with the adhesive layer 220 facing the phosphor 535. As shown in FIG. 5B, vacuum may be applied, then the converter layer bonding device 200 brought into contact with phosphor 535 at elevated temperature (for example, between 50° C. and 150° C., e.g., 100° C.) so that the adhesive layer 220 may be in contact with the surface of the phosphor 535 to be bonded. As shown in FIG. 5C, once the converter layer bonding device is cooled, the release liner 210 may be removed, leaving adhesive layer 220 behind on phosphor 535. In FIG. 5D, LED die 540 may be attached to the adhesive layer 220, using, for example, a pick-and-place tool as is known by persons having ordinary skill in the art. The LED die 540 are positioned onto the adhesive layer 220 with the light emitting side of the LED die facing and in contact with the adhesive layer 220. The adhesive layer 220 may then be cured at an elevate temperature (for example, between 50° C. and 150° C., e.g., 100° C.) to form bond layer 520 that is transparent. As shown in FIG. 5D, the phosphor 535 may then be singulated by forming slots 550 through the bond layer 520 and phosphor 535 between each LED die 540 if desired.

Figure 5E:
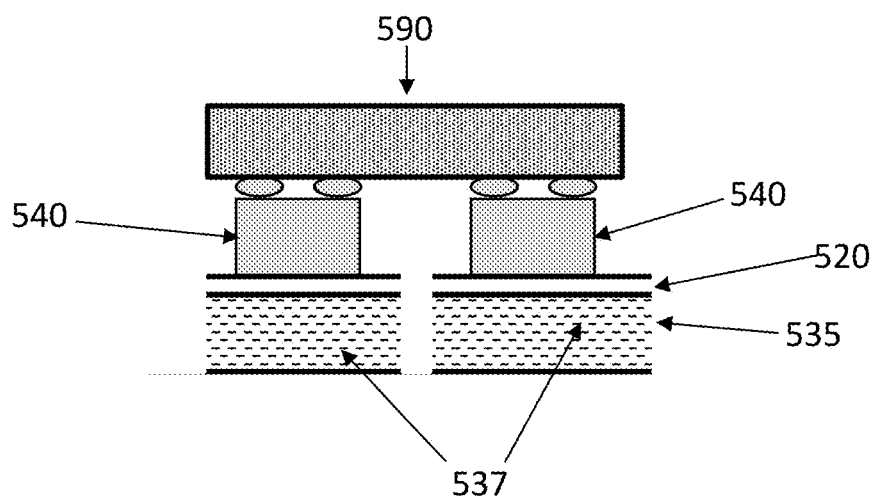

This method illustrated in FIGS. 5A-5E may be used to form light emitting pixel arrays, such as micro-LEDs. The representative LED die 540 and bonded phosphor portions 537 may be a portion of a large array of LED die. As shown in FIG. 5E, the light emitting device shown in FIG. 5D may be electrically connected to a signal source, such as with a substrate 590, that provides each LED die 540 with a signal, such that each LED die 540 is individually addressable. The carrier tape 530 may be removed by methods known to persons having ordinary skill in art, resulting in a micro-LED having a thin and uniform bond layer 420 attaching the phosphor to the numerous LED die. In another example, each LED die 540 represents a die with multiple pixels and phosphor 535 a phosphor tile to form multiple light emitting pixel arrays, and advantageously each will have a bond layer 520 with a consistent, uniform thickness.

The resulting LED devices each have a phosphor portion 537 bonded to an LED die 540. The converter layer bonding device 200 and method can form a bond layer 520 between each LED die 540 and phosphor portion 537 that is very thin, between 0.3 µm and 30 µm, for example, between 1 µm and 2 µm, as described above, and have a very uniform thickness, as described above. Additionally, the bond layer 520 substantially maintains the shape of the of the adhesive layer 220, and thus does not flow out of or over the edges of the LED die 540 and phosphor 537. Additionally, when singulated, the bond layer 520 can be cleanly diced, which also leaves the edge of the bond layer flush with the edge of the phosphor 535 and/or the LED die 540.

FIGS. 6A-6D illustrate an example application of the converter layer bonding device in which the adhesive layer is transferred onto a phosphor, followed by phosphor array patterning and LED die attach. A converter layer bonding device 200 may be prepared as described above with respect to FIGS. 2A-2D.

Figure 6A:
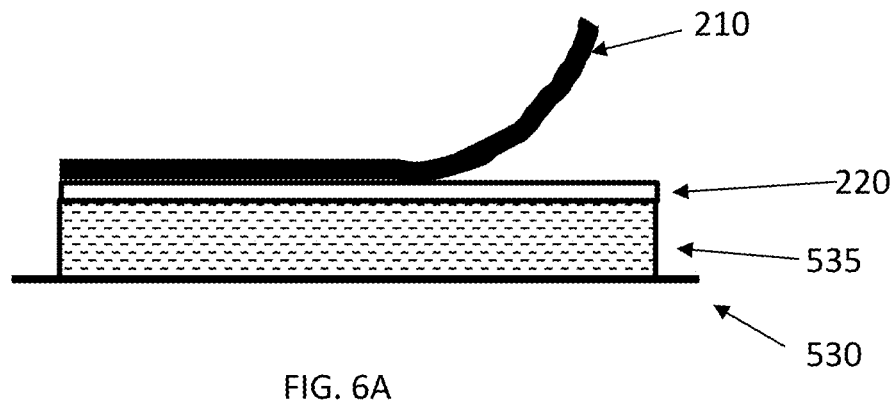
FIG. 6A, FIG. 6B, FIG. 6C, FIG. 6D and FIG. 6E illustrate another example application of a converter layer bonding device as disclosed herein and resulting pcLED device.
Figure 6B:
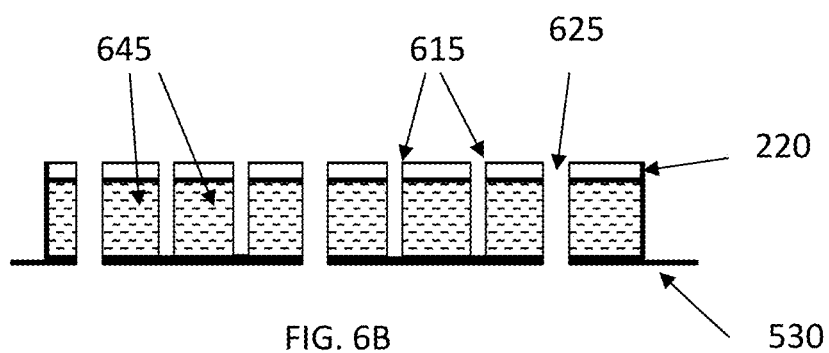
Figure 6C:
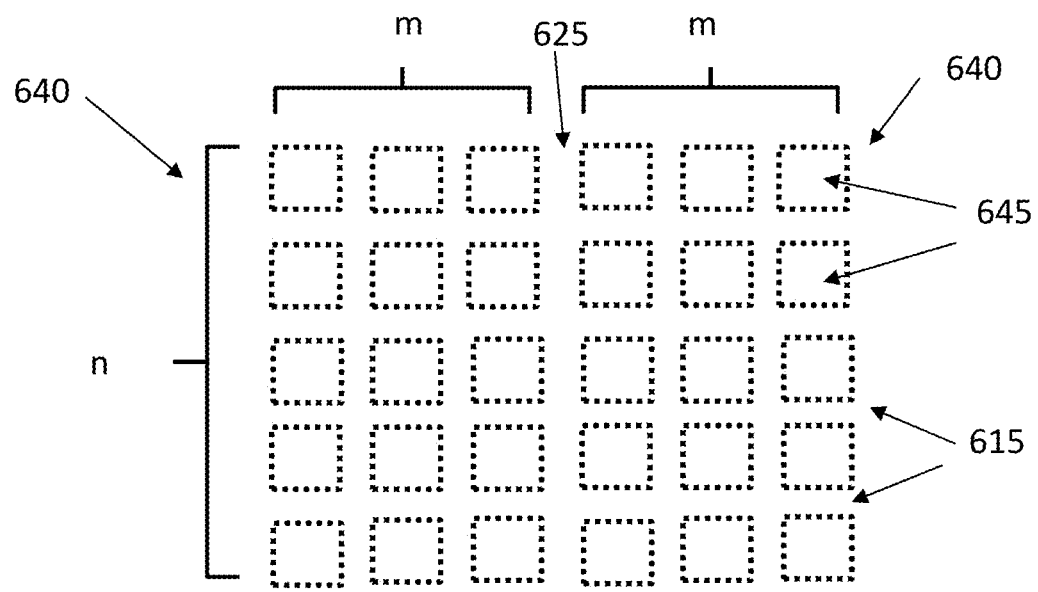
Figure 6D:
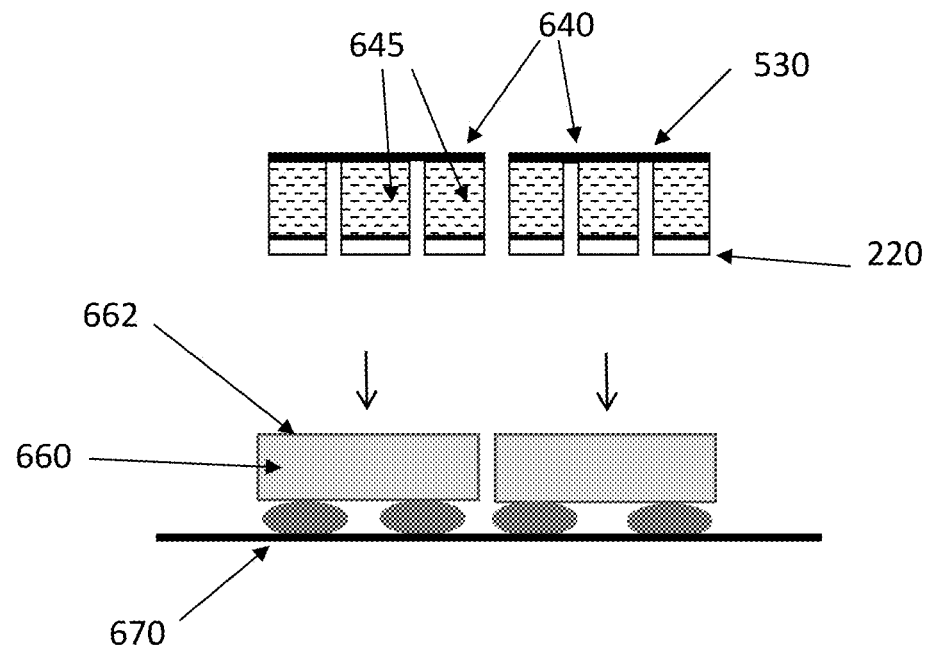
Figure 6E:
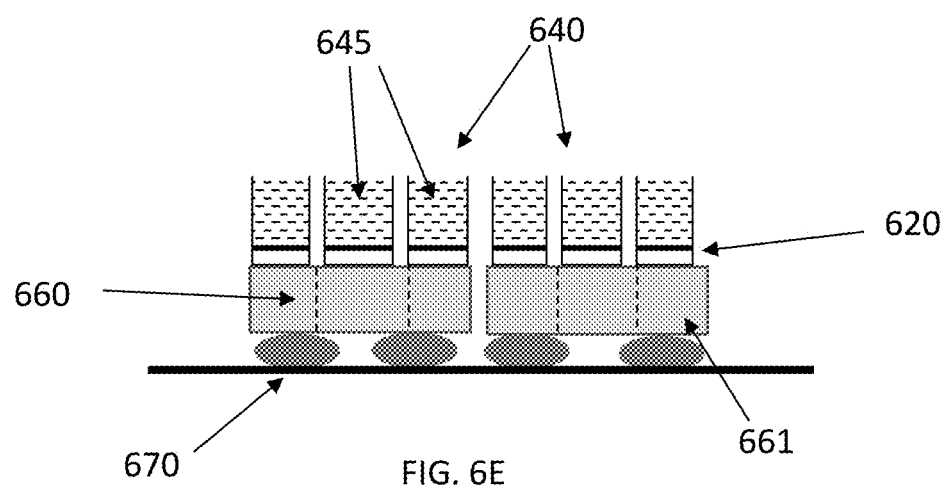

FIG. 6A shows adhesive layer 220 transferred onto phosphor 535 on carrier tape 530 by a vacuum lamination method as described above with respect to FIGS. 5A-5C. As shown in FIG. 6B, after removal of the release liner 210, the phosphor 535 and adhesive layer 220 may be patterned, for example, into n×m arrays of phosphor tiles 640. FIG. 6C is a plan view of the n×m arrays of phosphor tiles 640 of FIG. 6B. Patterning of the phosphor 535 and adhesive layer 220 may accomplished by any applicable manner of dicing, segmenting, dividing, apportioning, slicing or compartmentalizing as is known in the art, such as, for example, sawing, etching, applying a mask to dice, using one or more lasers, and/or chemical treatments. Patterning may include forming slits 615 through the phosphor 535 and adhesive layer 220, but not the carrier tape 530, to form individual phosphor elements 645 of the n×m arrays of phosphor tiles 640. Patterning may also include slicing through the carrier tape 530 to form openings 625, which separate n×m arrays 640 if multiple arrays are to be formed. As shown in FIG. 6D, the n×m arrays 640 may be placed onto to LED die 660 such that the adhesive layer 220 is in contact with the light emitting face 662 of the LED die 660. LED die 660 may be on substrate 670 for this purpose. A pick-and-place tool may be used to place the n×m arrays of phosphor tiles 640 on the LED dies 660, as in known in the relevant art. The n×m arrays 640 on the LED dies 660 may then be heated to an elevated temperature (for example, between 50° C. and 150° C., e.g., 100° C.) to heat and fully cure the adhesive layer 220 and form bond layer 620 that is transparent.

The method shown in FIGS. 6A-6E may be used to form micro-LEDs. LED die 660 in FIGS. 6D and 6E may include numerous minute LEDs that form the micro-LED, and each n×m phosphor array 640 may be aligned over each of the minute LEDs 661 in LED die 660. That is, the dimension and count of the minute LED die pixels 661 in LED die 660 match up with those of the n×m arrays 640. Thus, multiple micro-LEDs may be formed using this method, and advantageously, each will have a bond layer with a consistent, uniform thickness.

FIGS. 7A-7D show transferring the adhesive layer onto LED die on tile, which LED die may have significant surface topography. A converter layer bonding device 200 may be prepared as described above with respect to FIGS. 2A-2D.

Figure 7A:
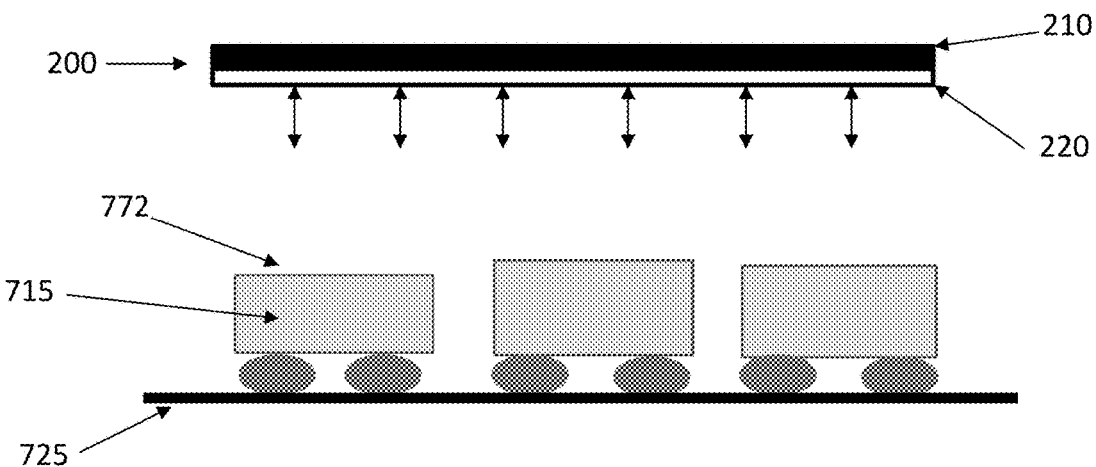
FIG. 7A, FIG. 7B, FIG. 7C and FIG. 7D illustrate another example application of a converter layer bonding device as disclosed herein and resulting pcLED device.
Figure 7B:
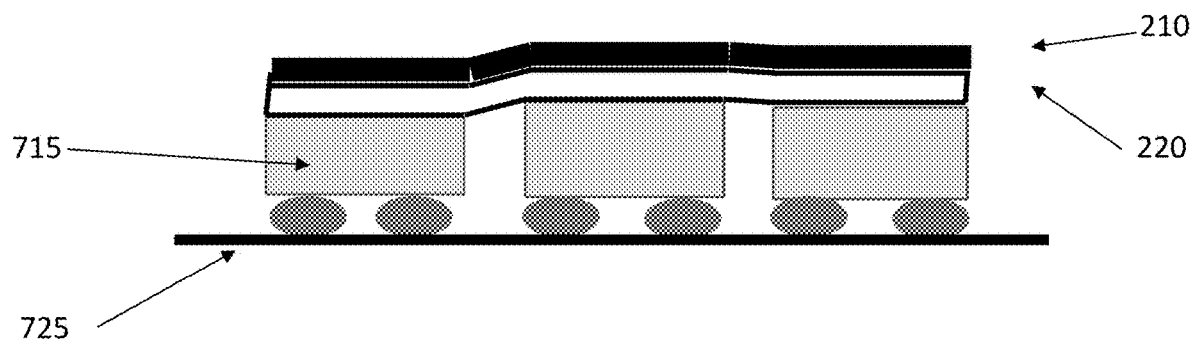

As shown in FIG. 7A, LED die 715 may be attached to a substrate, such as a tile. This may create a significant (potentially in the range of >100 µm) height variations in the top of the LED die 715. Before transferring the adhesive layer 220, the LED die surface may be O2-plasma treated to improve adhesion of subsequently-transferred adhesive layer 220. Vacuum lamination, as described above with respect to FIGS. 4A-4E may then be used to transfer the adhesive layer 220 onto the die surface, as shown in FIG. 7B.

Figure 7C:
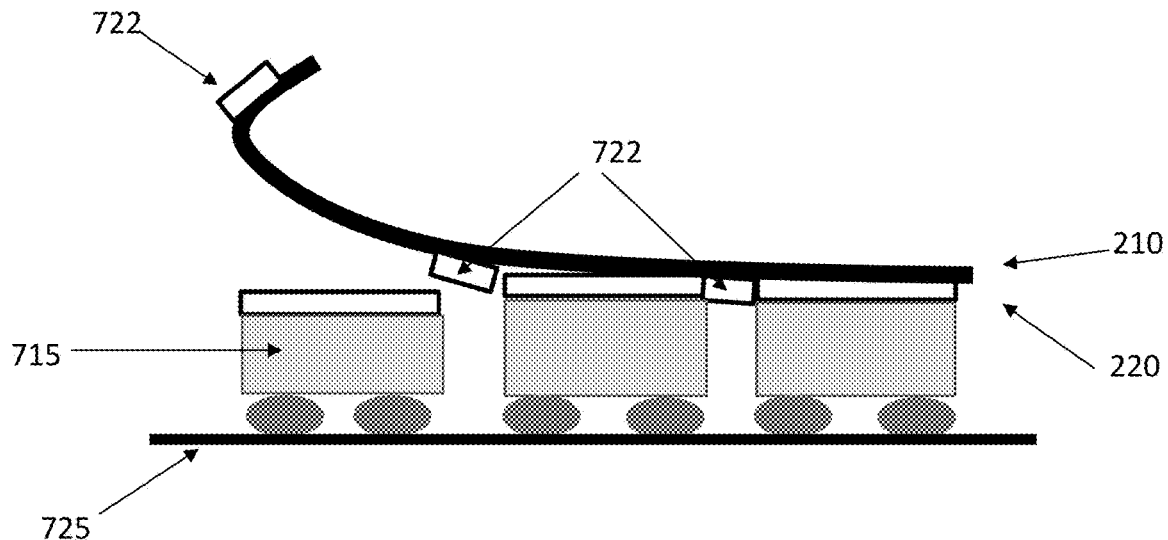
Figure 7D:
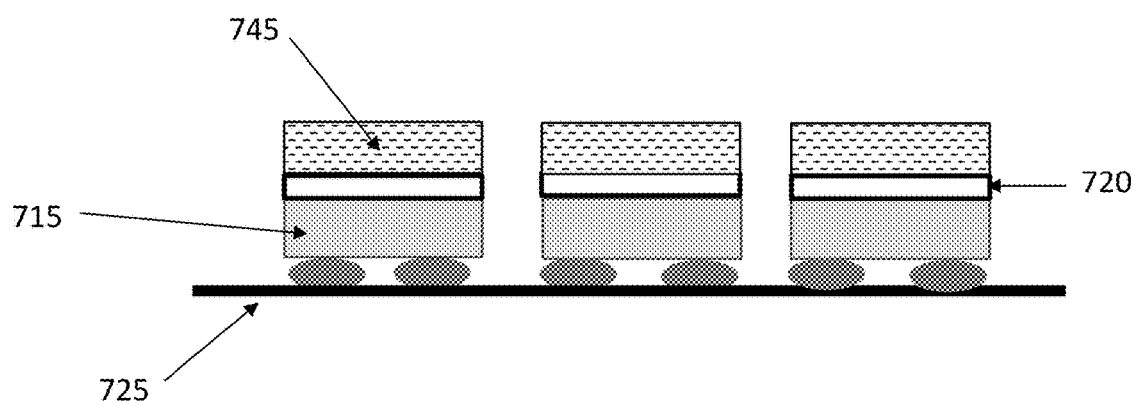

Once the converter layer bonding device is cooled, release liner 210 may be removed as shown in FIG. 7C. Removal of the release liner 210 leaves a uniform adhesive layer 220 only on the surfaces 772 of the LED die 715. Portions 722 of the adhesive layer 220 that are between LED die 715 are not adhered to the LED die 715 and thus are not transferred and remain on the release liner 210. As shown in FIG. 7D, phosphor platelets 745 may then be placed on the adhesive layer 220 on the LED die 715 at elevated temperatures (for example, between 50° C. and 150° C., e.g., 100° C.) to fully cure adhesive layer 220 and form bond layer 720 that is transparent. A pick-and-place tool may be used to place the phosphor platelets 745.

Figure 8A:
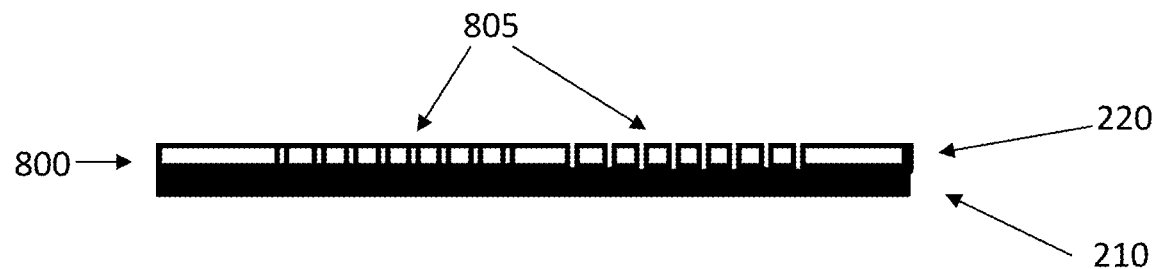
FIG. 8A is a cross-sectional view and FIG. 8B is a plan view illustrating a patterned converter layer bonding device according to an example embodiment.
Figure 8B:
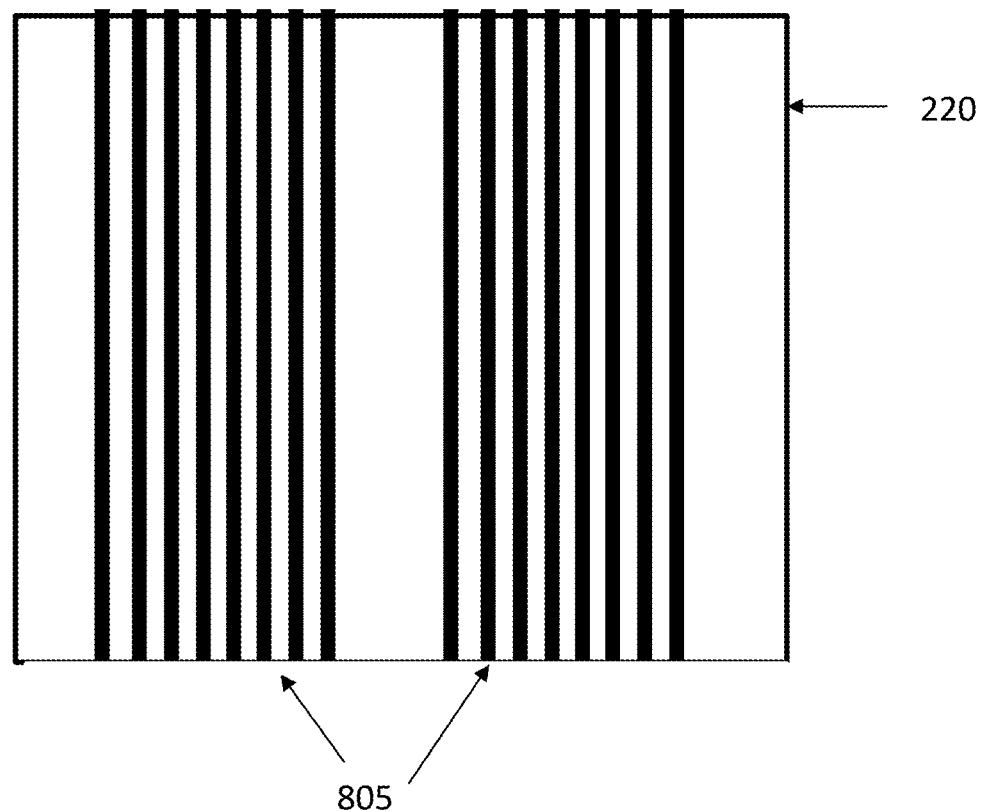

FIGS. 8A and 8B show a cross-sectional view and plan view, respectively, of a converter layer bonding device having a patterned adhesive layer that can be used, for example, to improve oxygen permeability, which reduces browning and thus improves transparency and device performance (as described, for example, in Cree® XLamp®

LEDs Chemical Compatibility, CLD-AP63 REV 6A, August, 2018, Cree, Inc., incorporated herein by reference in its entirety). A converter layer bonding device 200 may be prepared as described above with respect to FIGS. 2A-2D. Cutting the channels 805 may be accomplished by methods including, for example, dicing, laser ablation or laser cutting, and stamping, as is known by persons having ordinary skill in the art, and is possible because the adhesive layer 220 is relatively solid at a first, lower temperature, such as room temperature. Channels 805 of a given kerf are cut into adhesive layer 220, but release liner 210 is left intact. The channels 805 may be open on at least one of the edges of the adhesive layer 220, so as to allow ambient gasses, such as air or pure oxygen, to pass into the adhesive layer 220. The size and spacing of the channels depend on the application. The channels may only be large enough to allow gas to pass into the layer, and may be spaced close enough together so that the gas entering the channels can diffuse significantly into the bond layer, but not so many channels or so close together to weaken the bonding. For example, channels with a width of 20 μm may be diced into the layer with a pitch of 200 μm. The resulting patterned converter layer bonding device 800 may be used in a similar manner to the converter layer bonding device 200 as disclosed herein.

Figure 9A:
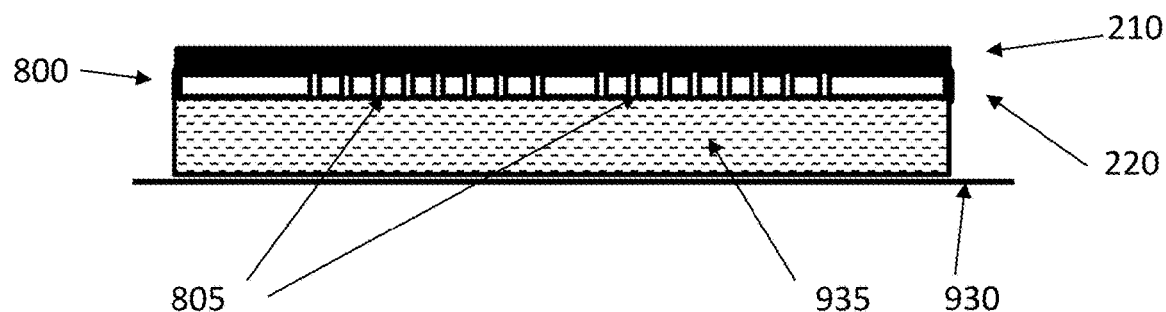
FIG. 9A, FIG. 9B, FIG. 9C and FIG. 9D illustrate an example application of a patterned converter layer bonding device as disclosed herein and resulting pcLED device.
Figure 9B:
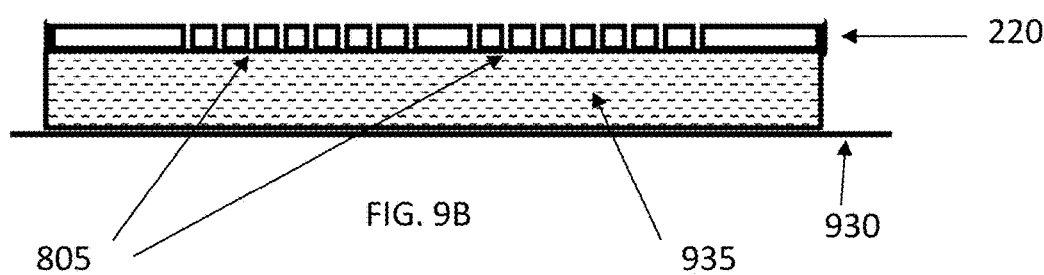
Figure 9C:
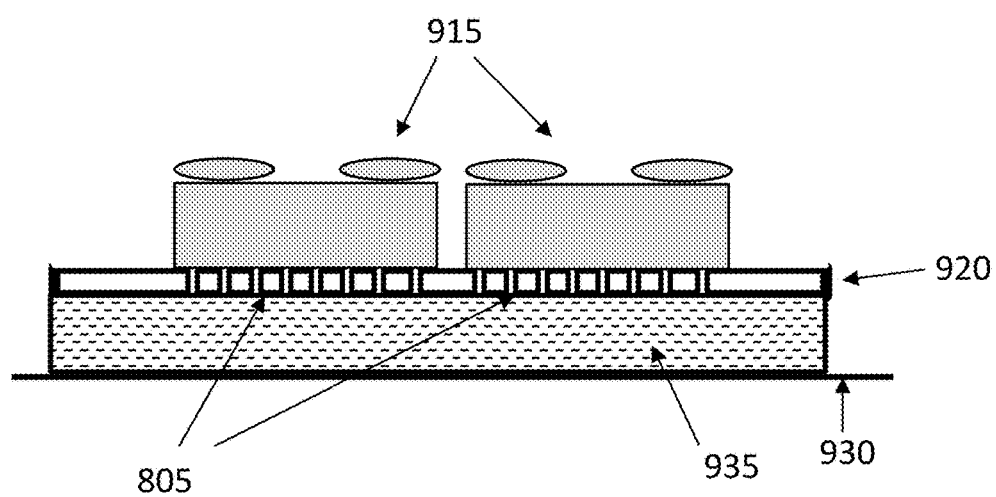
Figure 9D:
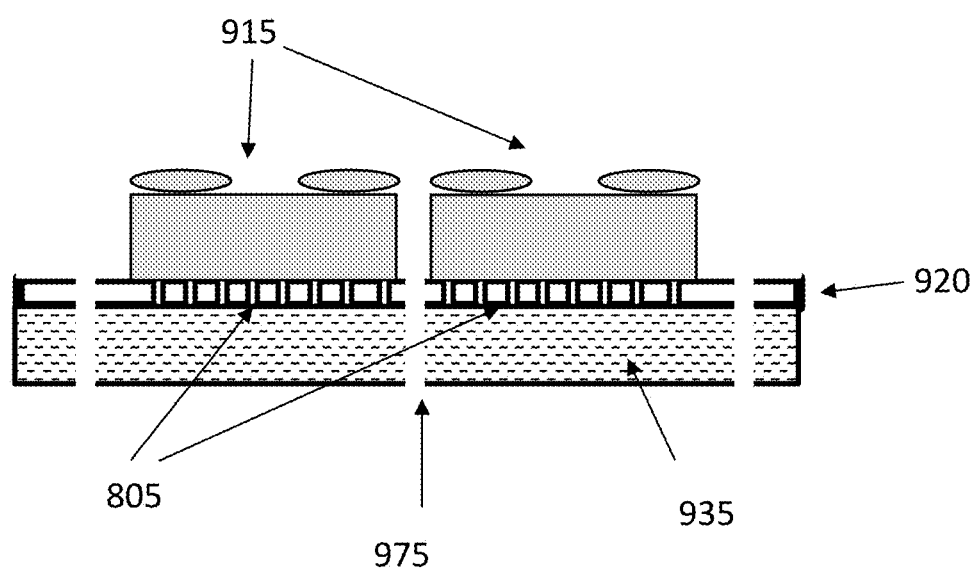

FIGS. 9A-9D illustrate use of a patterned converter layer bonding device 800. In FIGS. 9A-9D, a phosphor film or wafer 935 may be mounted onto a carrier tape 930. The phosphor wafer 935 may be $O_2$-plasma treated to improve adhesion of subsequently-transferred adhesion layer 220 having channels 805. Vacuum lamination is then used to transfer the adhesive layer 220 having channels 805 onto the phosphor 935 as disclosed above with respect to FIGS. 5A-5D. As shown in FIG. 9A, after aligning the converter layer bonding device 800 with the phosphor wafer 935, vacuum may be applied, then the converter layer bonding device 800 may be brought into contact with phosphor 935 at elevated temperature (for example, between 50° C. and 150° C., e.g. 100° C.) so that the adhesive layer 220 with channels 805 may be in contact with the surface of the phosphor 935 to be bonded. As shown in FIG. 9B, once the patterned converter layer bonding device 800 is cooled, the release liner 210 may be removed, leaving adhesive layer 220 having channels 805 adhered on phosphor 935. As shown in FIG. 9C, LED die 915 may be attached to the adhesive layer 220 having channels 805, using, for example, a pick-and-place tool as is known in the relevant art. The LED die 915 are positioned onto the adhesive layer 220 with the light emitting side of the LED die 915 facing and in contact with the adhesive layer 220, and also positioned over the channels 805. The adhesive layer 220 having channels 805 may then be cured at an elevate temperature (for example, between 50° C. and 150° C., e.g., 100° C.) to form transparent bond layer 920 having channels 805. As shown in FIG. 9D, the phosphor 935 may then be singulated by forming slots 975 through the bond layer 920 and phosphor 935 between each LED die 915 if desired.

The resulting transparent bond layer 920 between LED die 915 and phosphor 935 has open channels 805 of a certain aspect ratio, for example, having a 20 μm width and a depth (or height) that is the thickness T of the bond layer 920 or less than the thickness T of the bond layer, and, for example, may be 2 μm. Other examples of bond layers with channels, additives used to modify the optical characteristics, and use of a second material to back-fill the channels may be found in U.S. patent application Ser. No. 16/584,642 titled "Fabrication For Precise Line-Bond Control and Gas Diffusion Between LED Components", incorporated herein by reference in its entirety. These channels 805 may decrease the path length for oxygen to diffuse into the bond layer 920, reducing the browning that can occur to high refractive index/high phenyl-content siloxanes. Although FIGS. 8A and 8B illustrate a pattern with multiple straight channels 805, other patterns may be used. Also, the patterned converter layer bonding device 800 may be used in place of the converter layer bonding device 200 without patterns in any of the applications disclosed herein.

Figure 10A:
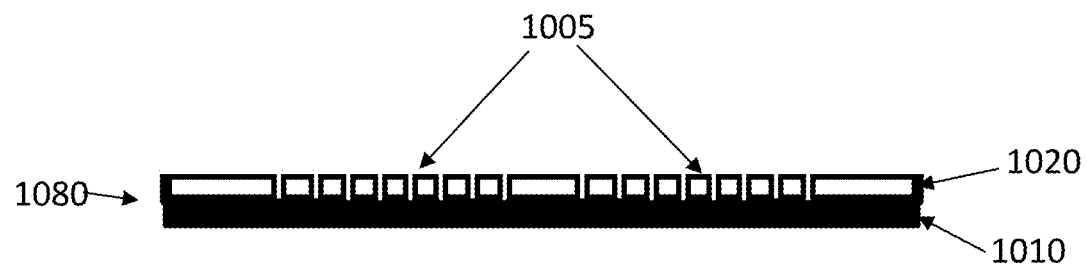
FIG. 10A, FIG. 10B, FIG. 10C, FIG. 10D and FIG. 10E illustrate an example embodiment of an application of a converter layer bonding device with stacked adhesive layers.
Figure 10B:
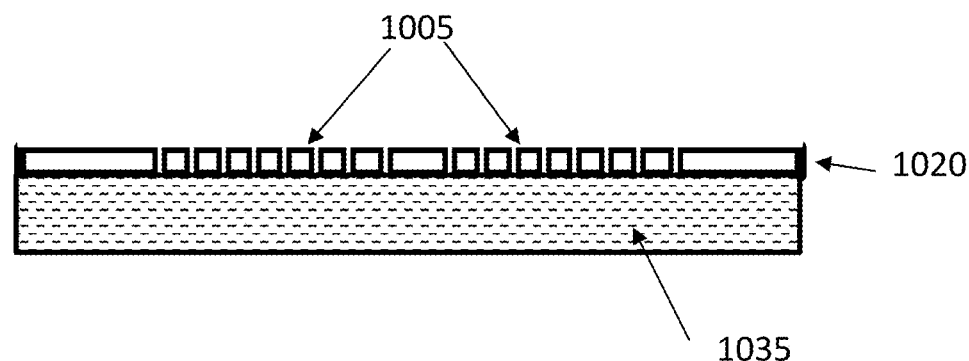
Figure 10C:
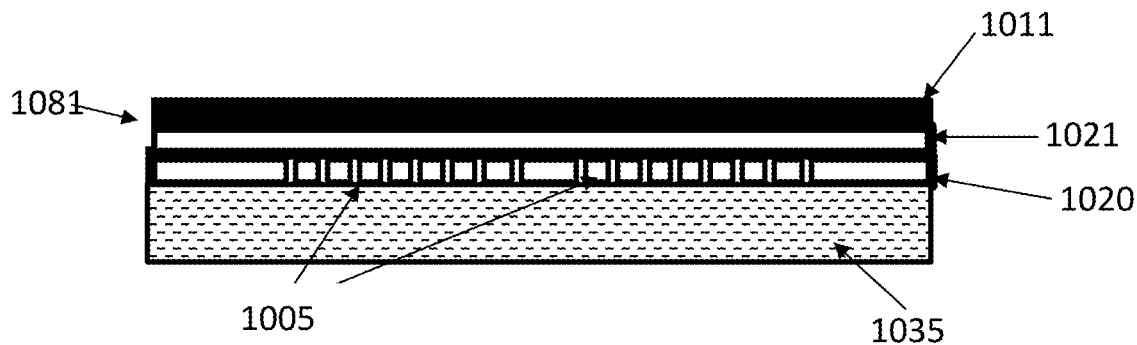
Figure 10D:
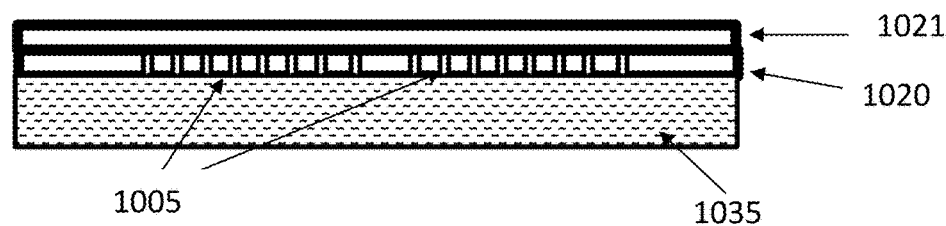

FIGS. 10A-10E illustrate an application of stacked adhesive layers by a multiple lamination process onto a phosphor wafer for improved oxygen permeability. In FIG. 10A, a first converter layer bonding device 1080 is prepared with a first adhesive layer 1020 on first release liner 1010 (as described with respect to FIGS. 3A-3D). First adhesive layer 1020 may, for example, be patterned to include channels 1005 as described above with respect to FIGS. 8A-8B. As shown in FIG. 10B, the first adhesive layer 1020 with channels 1005 may be transferred to phosphor 1035 in a manner as described above with respect to FIGS. 9A-9B. As shown in FIG. 10C, a second converter layer bonding device 1081, having second adhesive layer 1021 on second release liner 1011 may then be positioned onto and transferred to first adhesive layer 1020. Second converter layer bonding device 1081 may be prepared as described above with respect to FIGS. 3A-3D. Second adhesive layer 1021 may have different physicochemical characteristics than first adhesive layer 1020, such as, for example, higher oxygen permeability. As shown in FIG. 10C, the second adhesive layer 1021 of second bonding device 1081 is positioned so as to be in contact with the first adhesive layer 1020. The vacuum lamination process is then repeated, and the second converter layer bonding device 1081 is heated to an elevated temperature at which the second adhesive layer 1021 becomes adhesive, to adhere second adhesive layer 1021 to first adhesive layer 1020. The second converter layer bonding device is then cooled and the second release liner 1011 is removed, leaving the second adhesive layer 1021 adhered to the first adhesive layer 1020, which is adhered to phosphor 1035. This process may be repeated to add additional adhesive layers. The resulting stack of at least two adhesive layers 1020 and 1021, may have different optical and/or physical properties and/or morphologies.

Figure 10E:
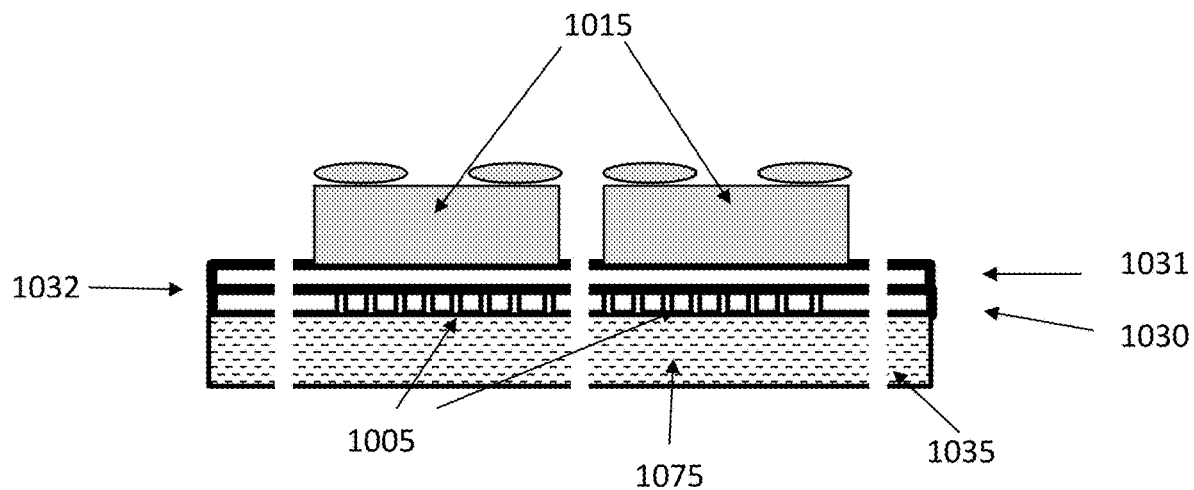

As shown in FIG. 10E, LED die 1015 may be attached to the second adhesive layer 1021 with the light emitting side of the LED die 1015 facing and in contact with the side of the second adhesive layer 1021 opposite the phosphor 1035. The LED die 1015 may be positioned on the second adhesive layer 1021 at an elevated temperature (e.g. 100° C.). A pick-and-place tool may be used for this purpose, as is known to persons having ordinary skill in the art. The multilayer adhesive stack of first adhesive layer 1020 and second adhesive layer 1021 is then fully cured to form multilayer bond layer 1032 having a first bond layer 1030 formed from the first adhesive layer 1020 and a second bond layer 1031 formed from second adhesive layer 1021. The multilayer bond layer 1032 and phosphor 1035 may be singulated. The resulting portion of the multilayer bond layer 1032 may have differentiated properties in each of the different layers. FIGS. 10A-10E illustrate an example where one layer has channels 1005 of a certain aspect ratio and the other layer does not have channels. The channels or/and the increased permeability of the stack towards oxygen will result in increased oxygen concentration in the bond layer, reducing the adhesive browning intrinsic to high refractive index/high phenyl-content siloxanes. Other embodiments of a multilayer bond layer may be made with layers that do not have channels but have other different physical properties, or that both have channels but the channels differ, for instance in direction of pattern or width of cut, or both layers may be the same. The different layer may have different physical characteristics, such as higher oxygen permeability, refractive index, or other optical characteristics, including, but not limited to scattering light, optical absorption and emission.

FIGS. 11A-11E illustrate another method of forming a multilayer bond layer, in this case by forming a converter layer bonding device that includes a multilayer adhesive layer.

Figure 11A:
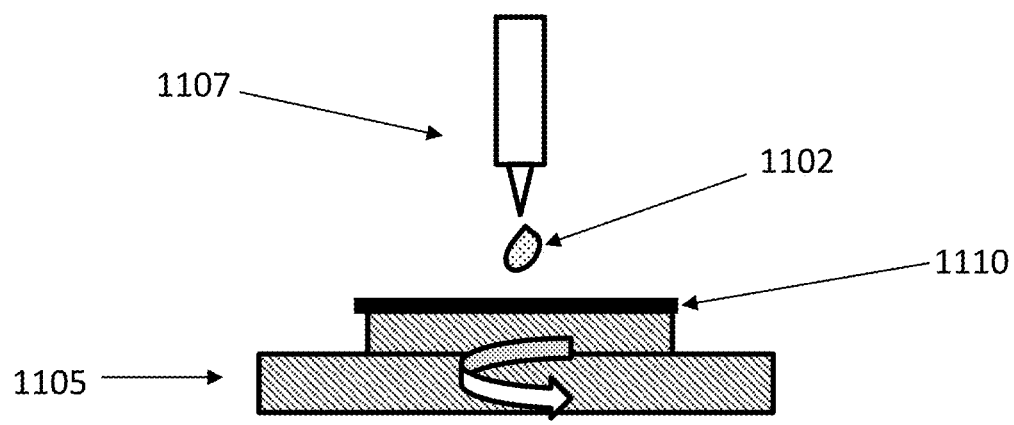
FIG. 11A, FIG. 11B, FIG. 11C, FIG. 11D and FIG. 11E illustrate an example embodiment of a method for forming a multilayer converter layer bonding device.

Similar to the method disclosed above with respect to FIGS. 3A-3D, the release liner 1110 to be used may be coated with a siliconized coating to enhance the release properties as described above (not shown). A first adhesive mixture 1102 may be prepared by mixing a first adhesive material with a solvent. As shown in FIG. 11A, the first adhesive mixture 1102 is then coated onto the release liner 1110. Any method that can suitably coat the release liner 1110 with a uniform layer of the first adhesive mixture 1102 at the desired thickness may be used, such as, for example, spin-coating, gravure printing, etc. FIG. 11A illustrates, as an example, a spin-coating process for coating release liner 1110 with the first adhesive mixture 1102. In FIG. 11A, the release liner 1110 is positioned on a spin-coating support 1105 and the first adhesive mixture 1102 is deposited from nozzle 1107 as is known by persons having ordinary skill in the art.

Figure 11B:
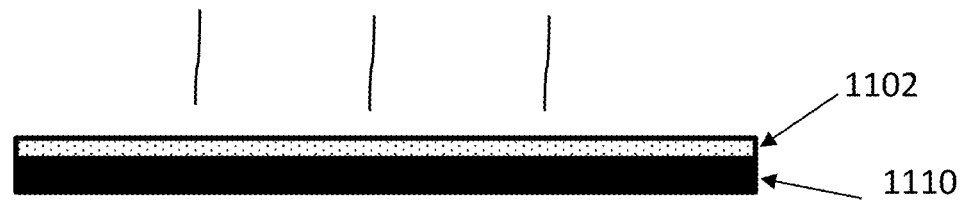

As shown in FIG. 11B, the first adhesive mixture 1102 coated onto release liner 1110 is dried to remove solvent. Depending on the adhesive used, the first adhesive mixture 1102 may be additionally cured to stabilize the material and improve uniformity of the subsequent transfer from the converter layer bonding device.

Figure 11C:
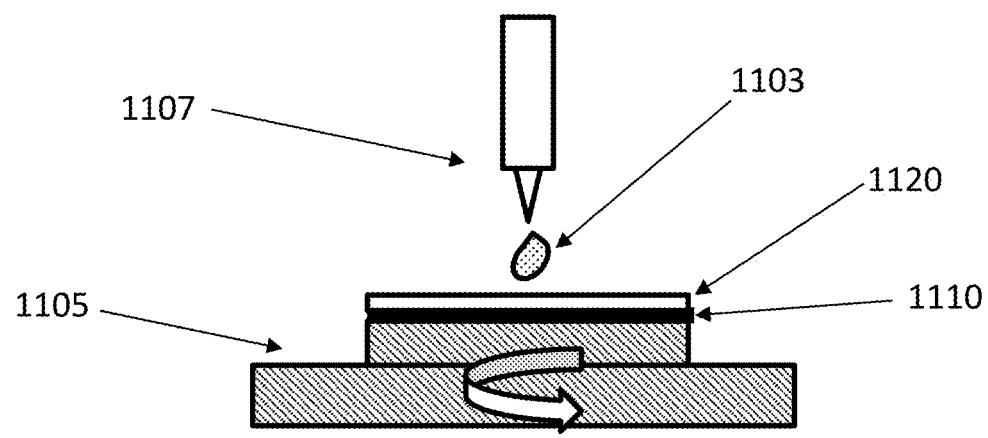

As shown in FIG. 11C, the release liner 1110 and first adhesive layer 1120 formed from the dried first adhesive mixture 1102 may then be coated with a second adhesive mixture 1103. Any suitable method may be used to coat second adhesive mixture 1103 onto the first adhesive layer 1120. FIG. 11C illustrates a spin-coating method as disclosed above.

Figure 11D:
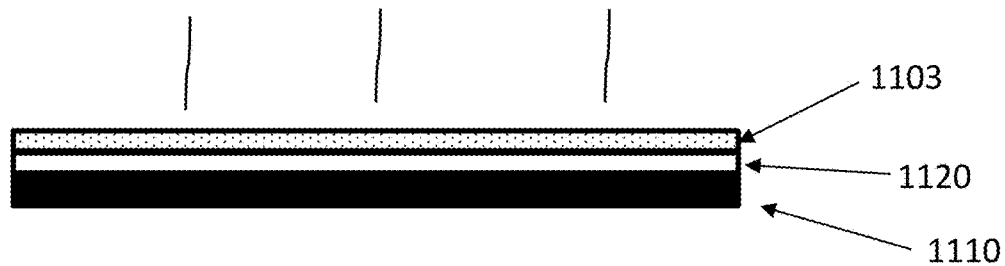
Figure 11E:

As shown in FIG. 11D, the second adhesive mixture 1103 may then be dried to remove solvent. The resulting converter layer bonding device 1100 is shown in FIG. 11E with second adhesive layer 1121 adhered on top of and in contact with first adhesive layer 1120, which is on release liner 1110. Both adhesive layers 1120 and 1121 may be thin (may be under 4 μm), uniform, defect-free, and can be made in a large area. The first adhesive layer 1120 and second adhesive layer 1121 may be different. The second adhesive layer 1121 may be patterned as described above with respect to FIGS. 8A-8B. The first adhesive layer 1120 may have different physical characteristics, such as higher oxygen permeability, refractive index, or other optical characteristics, including, but not limited to scattering light, optical absorption and emission, than the first adhesive layer 1121. The converter layer bonding device 1100 may be used in any applications in which a converter layer bonding device 1100 with a single adhesive layer is used, and may be used to transfer adhesive layers 1120 and 1121 to a substrate (e.g., a phosphor or LED die) in a same manner as disclosed above with respect to FIGS. 4A-4D for single adhesive layer 220.

The bond layer that is formed using the converter layer bonding device and methods disclosed herein, and the pcLED devices, including micro-LEDs, formed using the converter layer bonding device and method, have several advantages, in particular, as compared to the adhesive dispensing process conventionally used in the art. Because the adhesive layer is transferred onto the substrate, such as the phosphor or LED die, as a dry film, there will be no excess adhesive extruded out when phosphor and die are brought into contact, and therefore no "wings" or "fillets" along the edges of the devices. The dry adhesive layer does not spread out when transferred, but maintains its shape. The adhesive layer stays where it is positioned. Additionally, during the curing process, the temperature is controlled so that the resulting bond layer also does not flow and spread, but maintains its shape. Additionally, there will be no significant bond-line variation, as the thickness of the bond layer is determined before application by the thickness of the adhesive layer. Additionally, in the example disclosed above with respect to FIG. 8A-8E, the patterning of the adhesive layer can be performed to allow air channels in the pcLED device.

Figure 12A:
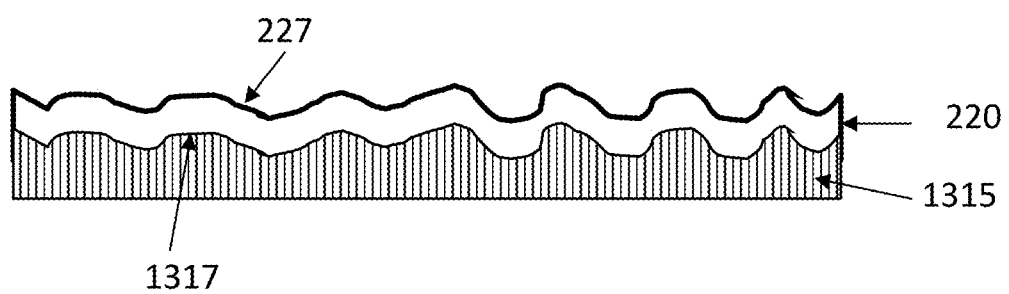
FIG. 12A illustrates an example of a bond layer on a substrate applied using a converter layer bonding device in accordance with an example embodiment.
Figure 12B:
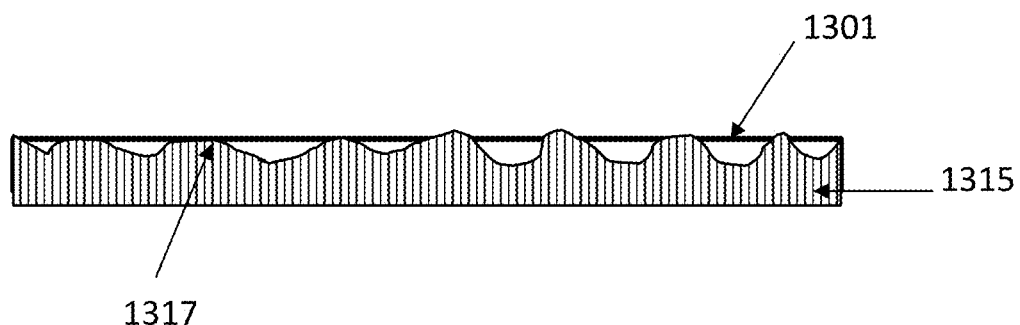
FIG. 12B, illustrates an adhesive layer applied to a substrate using conventional methods.

The bond layer formed using the converter layer bonding device and method disclosed herein also has advantages over other coating methods, such as spin-coating and spray-coating for applying adhesive. FIG. 12A shows a schematic of an expanded view of a substrate 1315 and the surface of the substrate 1317, which is rough and not flat. Phosphor tiles and LED dies may have such surface roughness. Adhesive layer 220 transferred onto the substrate 1315 using the converter layer bonding device and method disclosed here, conforms to the native surface roughness of the substrate 1315, while maintaining a uniform layer thickness T. FIG. 12B shows, for comparison, a surface coated with a conventional solution-state method for application of adhesive, for example, spin coating or spray coating. As seen in FIG. 12B, an adhesive solution 1301 flows to fill in the surface structures, and may leave portions of the surface exposed. Also, of note, is that the adhesive coating of FIG. 12A may result in small air voids between the adhesive layer and a sample surface to be bonded.

The devices and methods disclosed herein have several additional benefits over the methods typically used. First, the device and method can be used in a batch process, and can coat large areas in a single transfer. Thus, light emitting pixel arrays, such as micro-LEDs, that are formed from pcLEDs can be made efficiently and uniformly. Secondly, the device and method allow for precise control of the bond layer thickness, down to very thin (~1 μm) layers. Most importantly, the adhesive film transfer coating methods disclose herein are applicable to a wide variety of substrates, as it is less sensitive to surface roughness and surface energy than solution-state coating processes. As described with respect to FIGS. 12A and 12B above, even a substrate with significant surface topography, such as a tile with attached die, can be coated. Additionally, because transfer is a dry process, solvent compatibility with the target substrate is not an issue. Additionally, the adhesive layer can be patterned on the release liner before it is transferred to a substrate, as described with respect to FIGS. 8A-8B, this pattern facilitates gas transport and can prevent browning in high refractive index silicone adhesives, as well as improve optical performance in micro-LED applications.

This disclosure is illustrative and not limiting. Further modifications will be apparent to one skilled in the art in light of this disclosure and are intended to fall within the scope of the appended claims.

What is claimed is:

1. A light emitting device comprising:
 a plurality of individually addressable light emitting diodes mounted on a single chip;
 a plurality of phosphor tiles having a surface with a surface roughness; and a plurality of bond layers, each bond layer located between one of the individually addressable light emitting diodes and one of the phosphor tiles, each bond layer having a thickness, a variation in thickness of the bond layers across the single chip less than 20%, each bond layer contacting the surface of one of the phosphor tiles and conforming to the surface roughness of that surface while maintaining the variation in thickness of less than 20%.

2. The light emitting device of claim 1, wherein the thickness of each bond layer is between 0.3 μm and 2 μm.

3. The light emitting device of claim 1, wherein each bond layer contacts a surface of one of the light emitting diodes, the surface having a surface roughness, and each bond layer conforms to the surface roughness of the surface of the one light emitting diode while maintaining the variation in thickness of less than 20%.

4. The light emitting device of claim 1, wherein each bond layer located between one of the individually addressable light emitting diodes and one of the phosphor tiles includes multiple channels.

5. The light emitting device of claim 4, wherein the multiple channels have openings on an edge of the bond layer.

6. The light emitting device of claim 1, wherein each bond layer comprises a first bond layer in contact with one of the phosphor tiles and a second bond layer in contact with one of the light emitting diodes and with the first bond layer.

7. The light emitting device of claim 6, wherein the first bond layer has a different physical characteristic from the second bond layer.

8. The light emitting device of claim 6, wherein the first bond layer includes multiple channels.

9. The light emitting device of claim 6, wherein the first bond layer has a different refractive index from the second bond layer.

10. A light emitting device comprising:
a plurality of individually addressable light emitting diodes mounted on a single chip;
a plurality of phosphor tiles; and
a plurality of bond layers, each bond layer located between one of the individually addressable light emitting diodes and one of the phosphor tiles, each bond layer having a thickness of less than 2 μm and greater than 0.3 μm, a variation in thickness of the bond layers across the single chip less than 20%,
wherein each bond layer located between one of the individually addressable light emitting diodes and one of the phosphor tiles includes multiple channels.

11. The light emitting device of claim 10, wherein the variation in thickness is less than 10%.

12. The light emitting device of claim 10, wherein the multiple channels have openings on an edge of the bond layer.

13. A light emitting device comprising:
a plurality of individually addressable light emitting diodes mounted on a single chip;
a plurality of phosphor tiles; and
a plurality of bond layers, each bond layer located between one of the individually addressable light emitting diodes and one of the phosphor tiles, each bond layer having a thickness, a variation in thickness of the bond layers across the single chip less than 20%, each bond layer between each of the individually addressable light emitting diodes and phosphor tiles includes multiple channels.

14. The light emitting device of claim 13, wherein the multiple channels have openings on an edge of the bond layer.

15. The light emitting device of claim 13, wherein the thickness of each bond layer is less than 2 μm and greater than 0.3 μm.

16. The light emitting device of claim 13, wherein each bond layer contacts a surface of one of the phosphor tiles, the surface having a surface roughness, and each bond layer conforms to the surface roughness of the surface of the one light emitting diode while maintaining the variation in thickness of less than 20%.

17. The light emitting device of claim 13,
wherein each bond layer comprises a first bond layer in contact with one of the phosphor tiles and a second bond layer in contact with one of the light emitting diodes and with the first bond layer; and
wherein the first bond layer contains the multiple channels.

18. The light emitting device of claim 17, wherein the first bond layer has a different physical characteristic from the second bond layer.

19. The light emitting device of claim 17, wherein the first bond layer has a different refractive index from the second bond layer.

* * * * *